United States Patent [19]

Salas et al.

[11] 4,432,055

[45] Feb. 14, 1984

[54] SEQUENTIAL WORD ALIGNED ADDRESSING APPARATUS

[75] Inventors: Edward R. Salas, Billerica; Chester M. Nibby, Jr., Peabody; Robert B. Johnson, Billerica, all of Mass.

[73] Assignee: Honeywell Information Systems Inc., Waltham, Mass.

[21] Appl. No.: 306,839

[22] Filed: Sep. 29, 1981

[51] Int. Cl.³ .............................................. G06F 13/00
[52] U.S. Cl. .................................................. 364/200
[58] Field of Search ... 364/200 MS File, 900 MS File

[56] References Cited

U.S. PATENT DOCUMENTS

| | | | |
|---|---|---|---|
| 3,997,896 | 12/1976 | Cassarino et al. | 364/200 |
| 4,000,485 | 12/1976 | Barlow et al. | 364/200 |
| 4,181,974 | 1/1980 | Lemay et al. | 364/200 |
| 4,185,323 | 1/1980 | Johnson et al. | 364/200 |
| 4,236,203 | 11/1980 | Curley et al. | 364/200 |
| 4,376,972 | 3/1983 | Johnson et al. | 364/200 |

*Primary Examiner*—Jerry Smith
*Assistant Examiner*—Jameson Lee
*Attorney, Agent, or Firm*—Faith F. Driscoll; Nicholas Prasinos

[57] ABSTRACT

A memory subsystem which couples to a multiword bus for processing memory requests received therefrom includes at least a pair of independently addressable dynamic memory module units. Each memory unit includes a number of rows of random access memory (RAM) chips. The subsystem further includes an adder circuit, a pair of tristate operated address register circuits and timing circuits. The address circuits include a pair of tristate operated address registers which couple to the bus and to the set of address lines to each memory unit. In response to a memory request, the registers store row and column address portions of a chip address of the memory request. A multibit adder circuit which couples to the bus is connected to increment by one the low order column address portion when the least significant address bit of the memory request indicates a subboundary address condition thereby enabling access to a pair of sequential word locations. Whenever a memory request specifies an address which cannot access a double word, boundary circuits open detecting the condition cause the timing circuits to generate only timing signals necessary for accessing the first word location.

42 Claims, 10 Drawing Figures

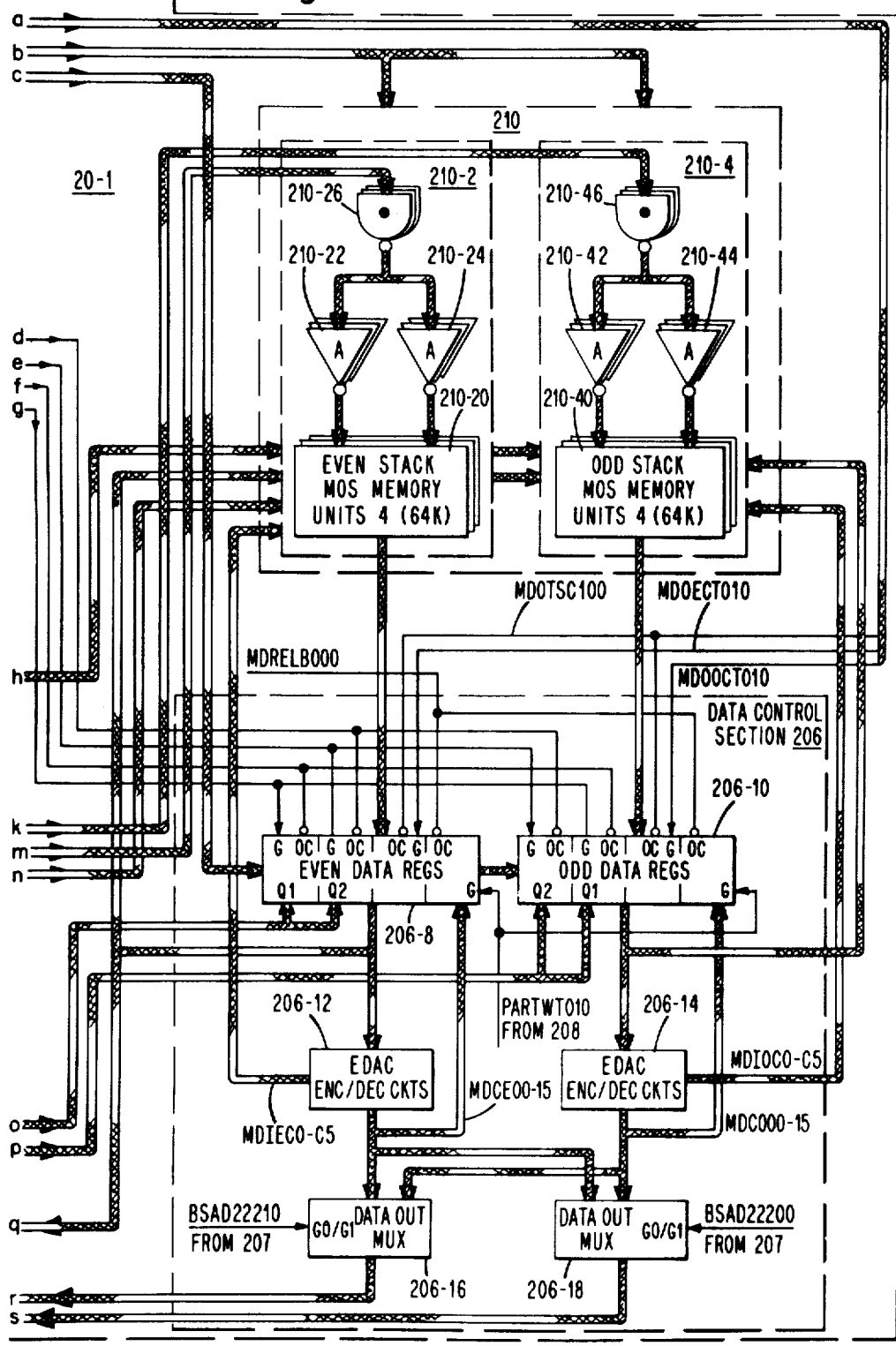
Fig. 3. (sheet 2 of 2)

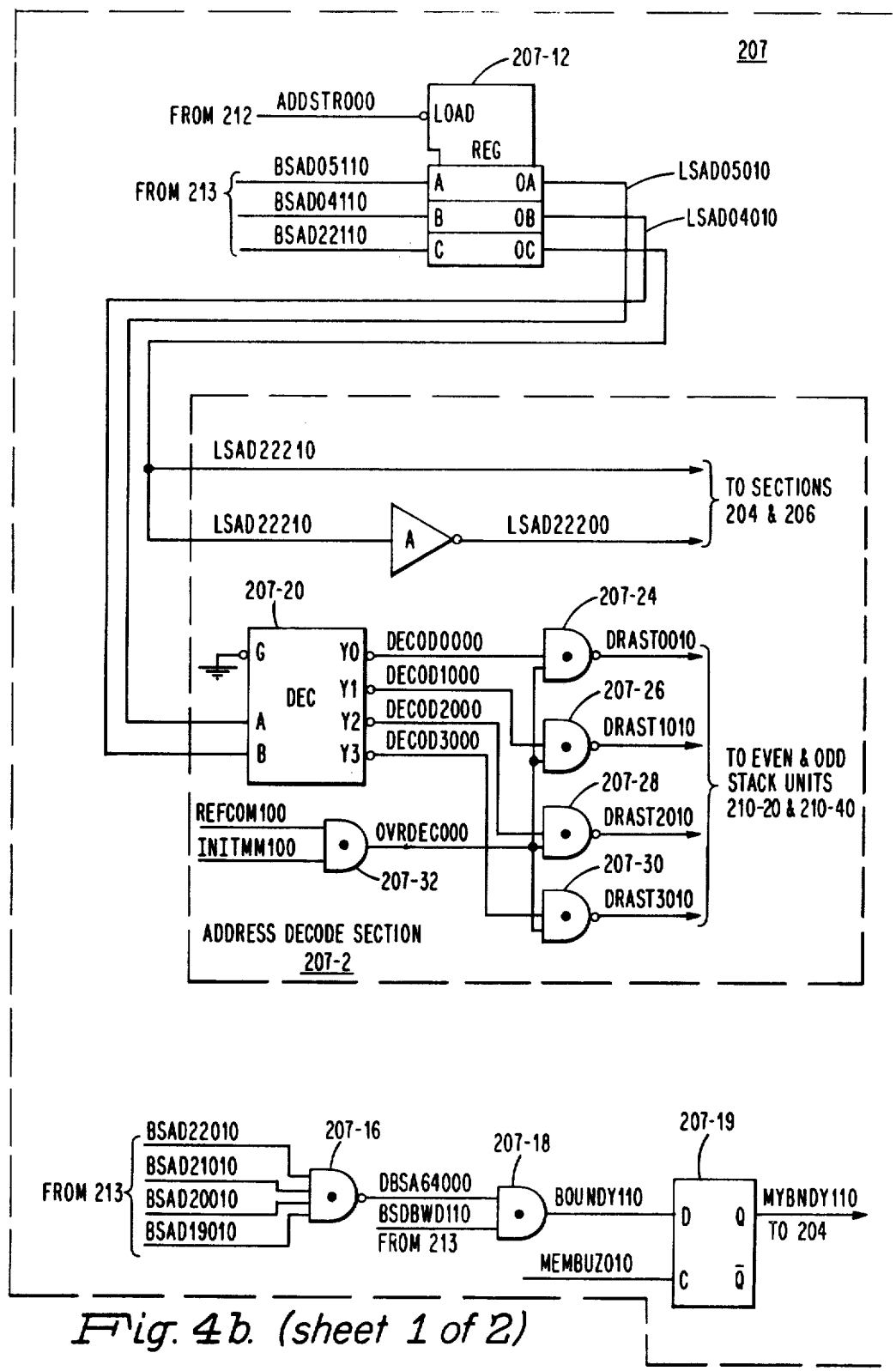
Fig. 4b. (sheet 1 of 2)

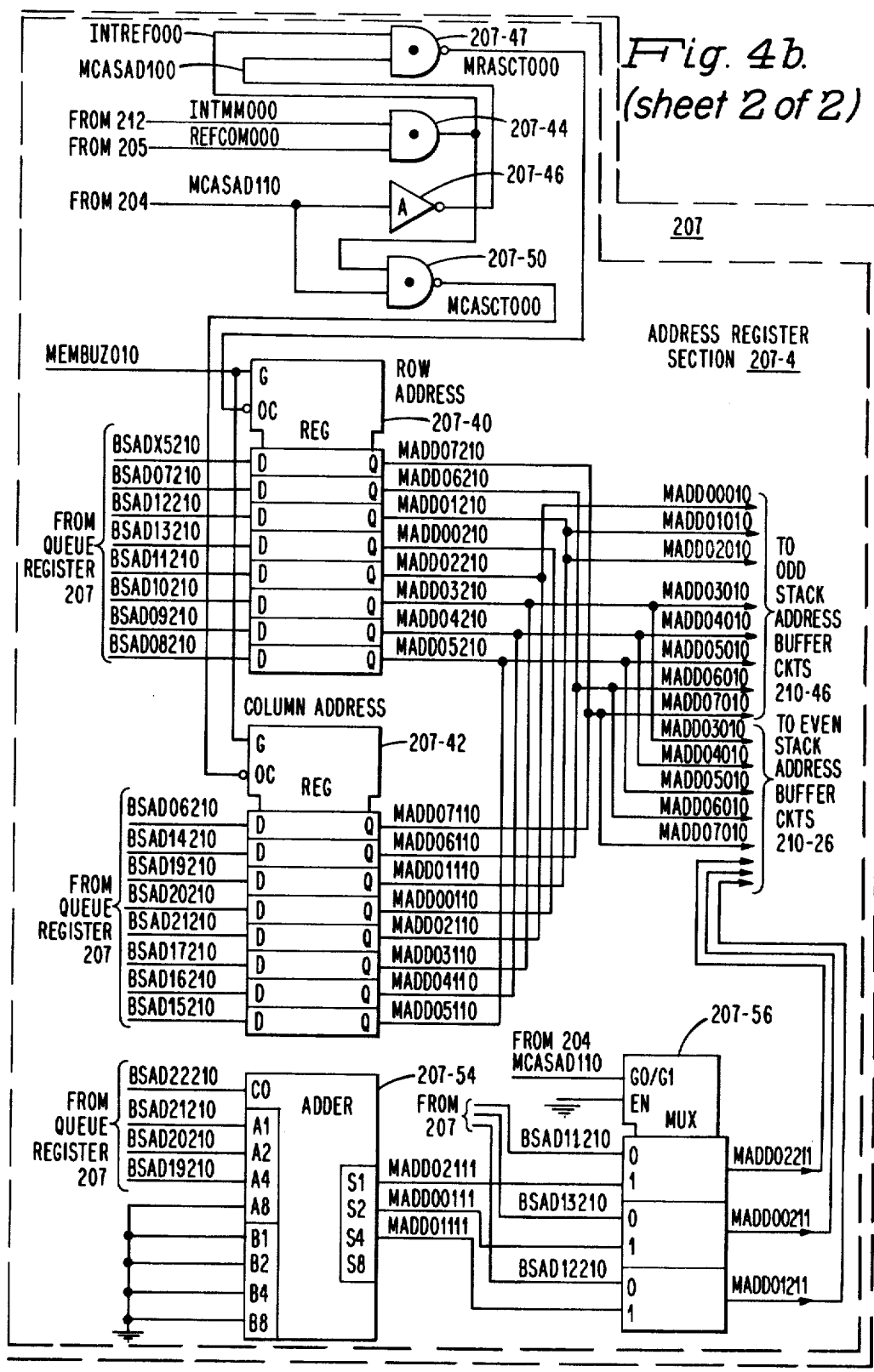
Fig. 4b. (sheet 2 of 2)

SEQUENTIAL WORD ALIGNED ADDRESSING APPARATUS

BACKGROUND OF THE INVENTION

1. Field of Use

This invention relates to semiconductor memory systems and more particularly to addressing apparatus therefor.

2. Prior Art

It is well known to construct memory systems from a number of memory modules. In certain prior art systems, memory modules are paired together to provide a double word fetch access capability. The term double word fetch access as used herein refers to the capability of being able to access a pair of words at a time from a memory system during a cycle of operation. This type of system is described in U.S. Pat. No. 4,236,203 titled "System Providing Multiple Fetch Bus Cycle Operation," invented by John L. Curley, Robert B. Johnson, Richard A. Lemay and Chester M. Nibby, Jr., issued Nov. 25, 1980 and assigned to the same assignee as named herein.

In the above prior art system, the memory system connects to an asynchronously operated single word wide bus. In the arrangement, a request for multiple words is made in a single bus cycle and the requested information words are delivered to the bus over a series of response cycles. While this arrangement improves the system throughput capabilities, it becomes desirable to be able to provide access to both words simultaneously over a single bus cycle.

It will be noted that in such paired memory module systems, it is necessary to generate even and odd addresses for accessing both memory modules. An address arrangement for accomplishing the generation is described in U.S. Pat. No. 4,185,323 titled "A Dynamic Memory System which Includes Apparatus for Performing Refresh Operations in Parallel with Normal Memory Operations," invented by Robert B. Johnson and Chester M. Nibby, Jr., issued Jan. 22, 1980 and assigned to the same assignee as named herein.

In the above arrangement, the low order bits of the address provided with the memory request specify the storage location being accessed while the high order bits specify which row of RAM chips is being selected. In order to fetch the second word of the pair being accessed, it is necessary to increment by one the memory request address and then decode the incremented address. This required that the memory address arrangement include a primary address register which also served as a counter and two parallel secondary address registers for storing the initial and incremented addresses received from the primary address register. This arrangement enables the processing of memory requests which start on any word boundary (i.e., allows access to an even or odd word). In addition to the amount of address register storage, the arrangement increases the delay in generating odd and even addresses for accessing both memory modules starting with either module.

Another addressing arrangement utilized in combination with a pair of independently addressable memory modules is disclosed in U.S. Pat. No. 4,376,972 titled "Sequential Word Aligned Address Apparatus," invented by Robert B. Johnson, Chester M. Nibby, Jr. and Dana W. Moore, issued Mar. 15, 1983 assigned to the same assignee as named herein. In order to reduce delay in generating addresses, the arrangement utilizes the least significant or low order address bits of a memory request address to specify which row of RAM chips contains the first word location to be accessed. Decoding circuits in response to such address bits generate a pair of output signals for simultaneously selecting a pair of words from the pair of modules. The address circuits include a multibit adder circuit and a pair of tristate operated address registers for storing row and column address portions of the memory request address. Each time the least significant address bits have a value indicative of a subboundary condition, the adder circuit increments by one the low order row address bits enabling access to the desired pair of word locations.

It has been found that the above incrementing operation can delay the overall performance of the memory. The reason is that the time allocated to each addressing operation must include the time required for address incrementing. While the decoder circuits in the above addressing arrangement increase memory performance by eliminating the need for address incrementing during nonsubboundary conditions, this advantage is reduced in situations where the subboundary condition occurs frequently because of a different memory organization.

Accordingly, it is an object of the present invention to provide a memory system which provides for the generation of addresses for the read out of a pair of words from a pair of memory modules.

It is a further object of the present invention to provide a method and apparatus which minimizes the circuitry and delay for providing the addresses for read out of at least a pair of words from a memory system which couples to a multiword bus.

SUMMARY OF THE INVENTION

The above and other objects are achieved in a preferred embodiment of the memory subsystem of the present invention which includes at least a pair of independently addressable memory module units which operatively couple to a multiword bus through separate data register circuits. Each memory module unit includes a number of rows of random access memory (RAM) chips.

According to the present invention, the address associated with each memory request received by the memory subsystem is coded so that the most significant or high order address bits specify which row of RAM chips contains the first word location to be accessed. The next less significant or lower order address bits specify the RAM chip address of a first word location to be accessed.

The memory subsystem further includes common addressing circuits and common timing circuits. The address circuits include a multibit adder circuit and a pair of tristate operated address registers for storing the row and column address portions of the chip address of the memory request address received from the bus. The output terminals of both registers connect in common to the sets of address lines applied to the different memory module units for address multiplexing. Additionally, the low order address lines applied to register storing the column address portion unit assigned the even memory addresses are applied in parallel to the adder circuit. The output of the adder circuit is applied to a multiplexer circuit which also is connected to receive low order row address bits also applied to the register storing the row address portion. The output of the multiplexer circuit is connected as a source of low order address bits for the memory module unit assigned the even addresses.

In response to a memory request, the timing circuits generate a sequence of timing signals which condition the address registers and multiplexer circuit to apply in succession the row and column addresses to the sets of address lines of the memory module units for accessing a plurality of sequential word locations. That is, the lower order row address bits are transferred to the even memory module via the multiplexer circuit. In parallel with such transfer, the low order column address bits modified or unmodified are passed through the adder circuit and are thereafter transferred via the multiplexer circuit to the even memory module at the same time the address bits of the column address portion are applied to the sets of address lines of the memory module units.

In the case of memory read request, a plurality of words are read out simultaneously to the data register circuits which connect through output multiplexer circuits to the sets of word lines which comprise the multiword bus. The multiplexer circuits selectively apply the plurality of words to the sets of word lines during a single bus cycle of operation in accordance with the state of the least significant address bit. That is, the even or odd word may be applied to each set of word lines as a function of the value of the least significant address bit. In a similar fashion, multiplexer circuits which connect to data register circuits and to the multiword bus enable the words received from the bus to be written into the correct memory module unit via the data register circuits during write operations.

Each time the least significant address bit has a pedetermined value which is indicative a subboundary address condition, during the transfer of the row address portion, the adder circuit increments by one the low order column address bits enabling access to the desired sequential pair of word locations within the memory module units. However, whenever a memory request specifies an address indicative of an actual boundary address condition, boundary circuits upon detecting the address condition the timing circuits to generate only the timing signals for accessing the first word location of the plurality.

The above arrangement is able to provide the required addresses for simultaneously accessing a plurality of sequential word locations in a plurality of memory module units during a single bus cycle of operation with a minimum of delay. This is accomplished without adversely affecting the performance of the system. That is, instead of incrementing the row address portion which is normally first tansferred to the memory module units, the addressing apparatus of the present invention operates to increment or modify the column address portion during the transfer of the row address portion to the memory module units. Accordingly, the column address portion can be transferred without any delay since the result of the incrementing operation has already been completed.

In the preferred embodiment, a 3-bit adder circuit increments the chip address by one every other word (i.e., when the least significant bit has the value "1"). Thus, the boundary condition occurs on word 15 or on a modulo 16 basis. By increasing the adder size, the boundary condition can be further extended.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 4a through 4c illustrate in greater detail different portions of the memory subsystem 20-1 of FIG. 3.

GENERAL DESCRIPTION OF SYSTEM OF FIG. 1

Figure 1:
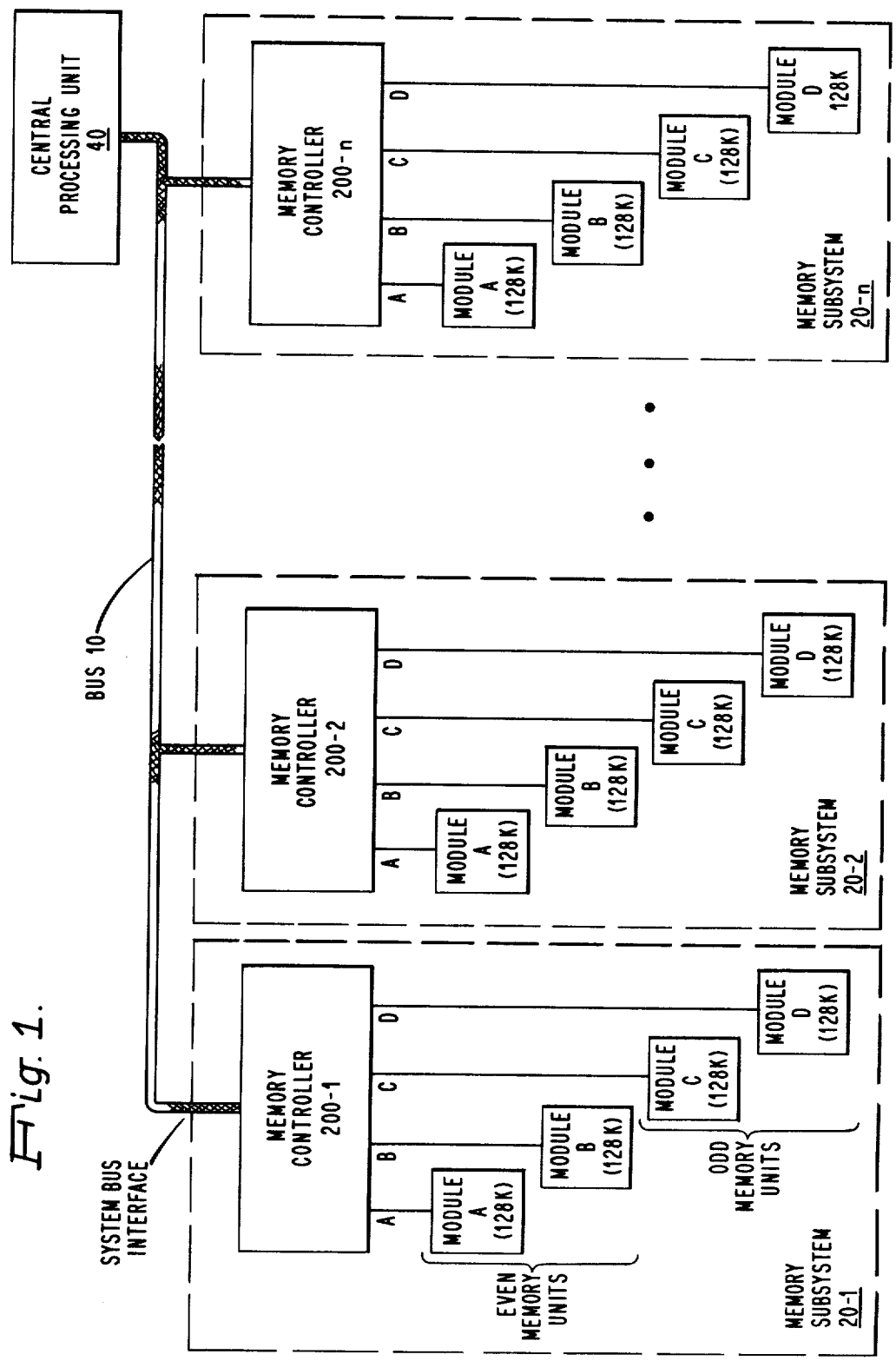
FIG. 1 shows in block diagram form a system which includes a memory system which includes the apparatus of the present invention.

FIG. 1 illustrates a data processing system which includes the apparatus of the present invention. Referring to the figure, it is seen that the system includes a multiline bus 10 coupled to n number of memory subsystems 20-1 through 20-n and to a central processing unit (CPU) 40. While only memory controllers are shown, it will be appreciated that the system of FIG. 1 will normally include other units such as those disclosed in U.S. Pat. No. 4,000,485 issued Dec. 28, 1976. Each of the memory subsystem include a memory controller (i.e., 200-1 through 200-n) which address four memory module units labeled A through D.

The CPU 40 is a microprogrammed processing unit which may for the purposes of the present invention may be considered conventional in design. The copending patent application cited above in addition to the patent application "System Providing Multiple Outstanding Information Requests," invented by Richard A. Lemay and John L. Curley, Ser. No. 867,266, filed Jan. 5, 1978 which issued on Jan. 1, 1980 as U.S. Pat. No. 4,181,974 and assigned to the same assignee as named herein may be consulted for further details. Also, the related patent application of George J. Barlow, et al., titled "Interface for Controlling Information Transfers between Main Data Processing Systems Units and a Central Subsystem" referenced herein may also be consulted.

Figure 2:
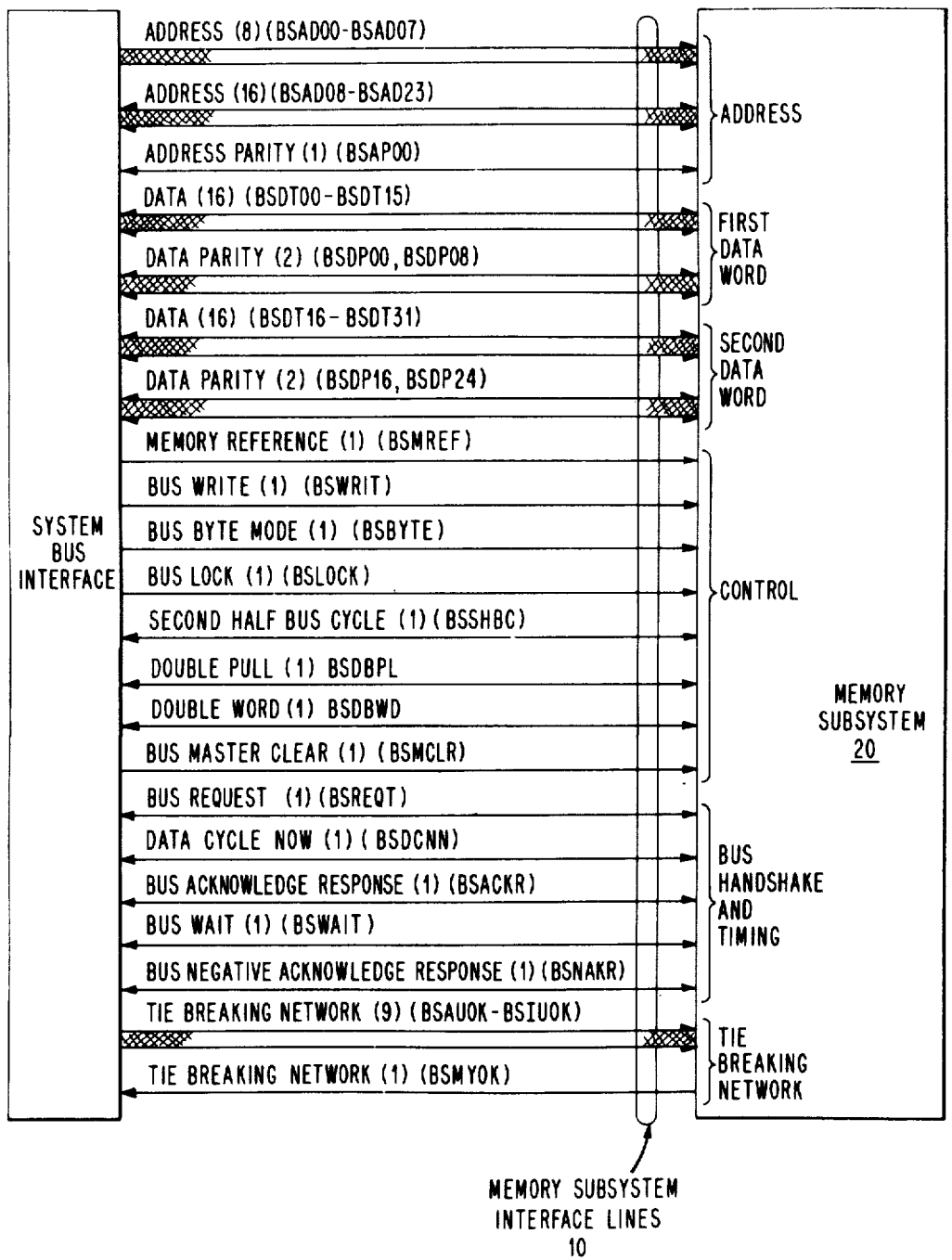
FIG. 2 shows in detail the lines of the system bus 10 which connect to the memory subsystem of FIG. 1.

The CPU 40 as well as each controller and memory subsystems communicate over the bus 10 in a predetermined manner as set forth in U.S. Pat. No. 4,000,485. Briefly, a unit wishing to communicate requests a bus cycle and when the bus cycle is granted, the unit becomes the "master" and is able to address any other unit in the system as the "slave". In the cases of those bus exchanges which require a response (e.g. memory read operation), the requesting unit as "master" identifies itself and indicates to the "slave" unit that a response is required. When the slave is ready to respond (e.g. obtains the information requested), it assumes the role of "master" and initiates the transfer of information to the requesting unit. Thus, the number of bus cycles vary depending upon the type of operation being performed. By altering the states of the signals applied to the control lines discussed in connection with FIG. 2, a unit is able to designate to the other unit, the type of cycle or operation being initiated or performed.

A distributed tie-breaking network grants bus cycles and resolves simultaneous requests for use of bus 10. Priority is granted on the basis of physical position on bus 10, the highest priority being given to the first unit on the bus. In a typical system, the memory subsystem is granted the highest priority and the CPU is granted the lowest priority with the other units being positioned on the basis of their performance requirements.

Memory Subsystem Interface

Figure 3:
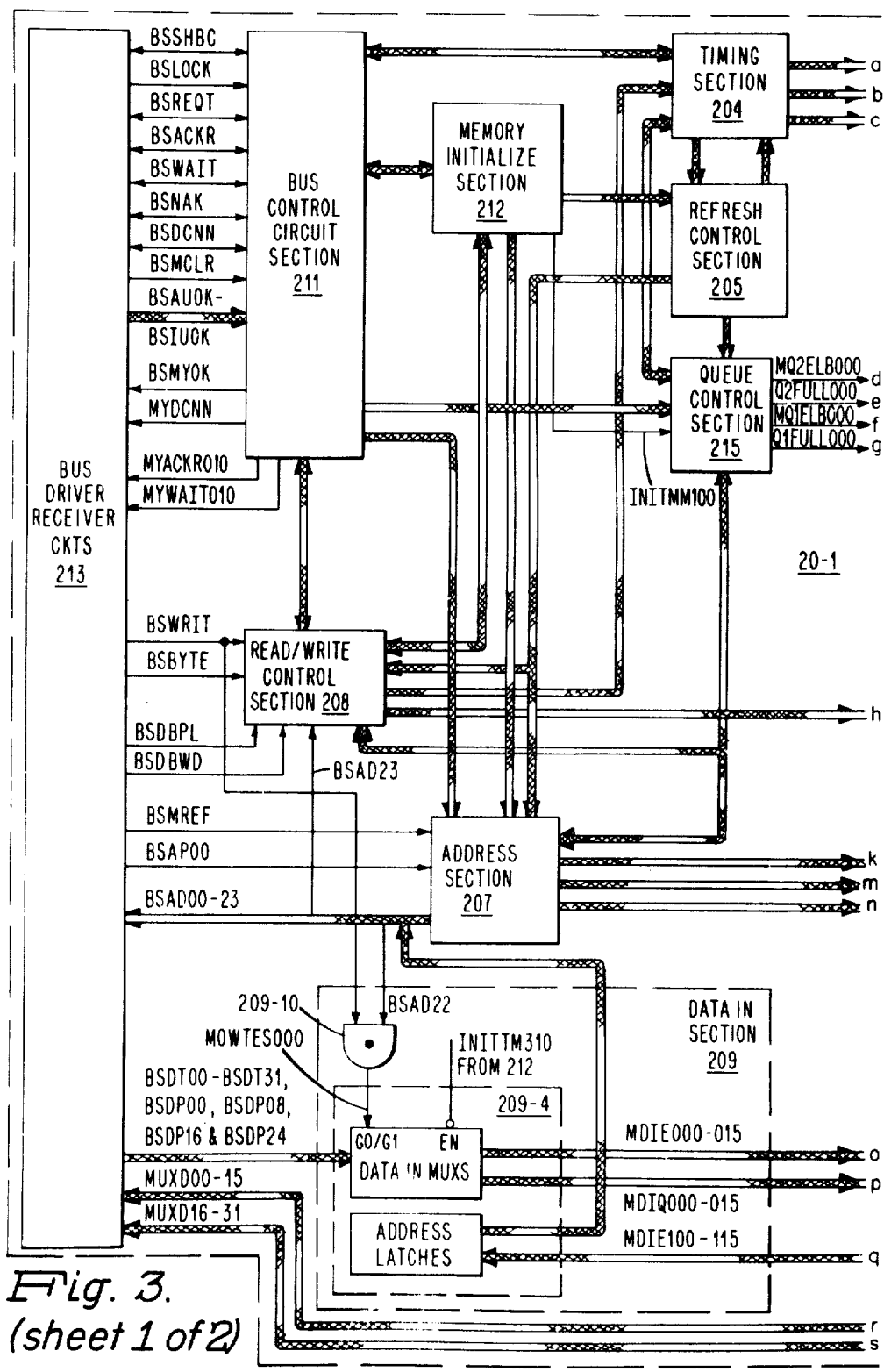
FIG 3 shows in block diagram form, the memory subsystem 20-1 of FIG. 1.

Before describing the controller of FIG. 3, it is seen that there are a number of lines which constitute the interface between each controller and bus 10. As shown, the interface lines include a number of address lines (BSAD00-23, BSAP00), two sets of data lines (BSDT00-15, BSDP00, BSDP08) and (BSDT16-31, BSDP16, BSDP24), a number of control lines (BSMREF-BSMCLR), a number of timing lines (BSREQT-BSNAKR), and a number of tie breaking network lines (BSAUOK-BSIUOK, BSMYOK).

The description of the above interface lines are given in greater detail in the section to follow.

| MEMORY SUBSYSTEM INTERFACE LINES | |
|---|---|
| Designation | Description |
| | Address Lines |
| BSAD00-BSAD23 | The bus address lines constitute a twenty-four bit wide path used in conjunction with the bus memory reference line BSMREF to transfer a 24-bit address to controller 200 or a 16-bit identifier from controller 200 to the bus (for receipt by a slave unit). When used for memory addressing, the signals applied to lines BSAD00-BSAD03 select a particular 512K word module, the signals applied to lines BSAD04-BSAD22 select one of the 512K words in the module while the signal applied to line BSAD23 selects one of the bytes within the selected word (i.e., BSAD23 = 1 = right byte; BSAD23 = 0 = left byte). When used for identification, lines BSAD00-BSAD07 are not used. The lines BSAD08-BSAD23 carry the identification of the receiving unit as transmitted to controller 200 during the previous memory read request. |
| BSAP00 | The bus address parity line is a bidirectional line which provides an odd parity signal for the address signals applied to lines BSAD00-BSAD07. |
| | Data Lines |
| BSDT00-BSDT15, BSDT16-BSDT31 | The sets of bus data lines constitute a 32-bit or two word wide bidirectional path for transferring data or identification information between controller 200 and the bus as a function of the cycle of operation being performed. During a write cycle of operation, the bus data lines transfer information to be written into memory at the location specified by the address signals applied to lines BSAD00-BSAD23. During the first half of a read cycle of operation, the data lines BSDT00-BSDT15 transfer identification information (channel number) to the controller 200. During the second half of the read cycle, the data lines transfer the information read from memory. |
| BSDP00, BSDP08, BSDP16, BSDP24 | The bus data parity lines are two sets of bidirectional lines which provide odd parity signals coded as follows: BSDP00=odd parity for signals applied to lines BSDT00-BSDT07 (left byte); BSDP08=odd parity for signals applied to lines BSDT08-BSDT15 (right byte); BSDP16=odd parity for signals applied to lines BSDT16-BSDT23; and BSDP24=odd parity signals applied to lines BSDT24-BSDT31. |
| | Control Lines |
| BSMREF | The bus memory reference line extends from the bus to the memory controller 200. When set to a true state, this line signals the controller 200 that the lines BSAD00-BSAD23 contain a complete memory controller address and that it is performing a write or read operation upon the specified location. When reset to a false state, the line signals controller 200 that the lines BSAD00-BSAD23 contain information directed to another unit and not controller 200. |
| BSWRIT | The bus write line extends from the bus to the memory controller 200. This line when set to a true state, in conjunction with line BSMREF being true, signals controller 200 to perform a write cycle of operation. When reset to a false state, this line, in conjunction with line BSMREF being true, signals controller 200 to perform a read cycle of operation. |
| BSBYTE | The bus byte line extends from the bus to controller 200. This line, when set to a true state, signals controller 200 that it is to perform a byte operation rather than a word operation. |
| | The bus lock line extends from the bus to controller 200. When set to a true state, this line signals controller 200 of a request to perform a test or change the status of a memory lock flip-flop included within the controller 200. |
| BSSHBC | The bus second half bus cycle line is used to signal a unit that the current information applied to the bus by controller 200 is the information requested by a previous read request. In this case, both controller 200 and the unit receiving the information are busy to all units from the start of the initiation cycle until controller 200 completes the transfer. This line is used in conjunction with the BSLOCK line to set or reset its memory lock flip-flop. When a unit is requesting to read or write and line BSLOCK is true, the line BSSHBC, when true, signals controller 200 to reset its lock flip-flop. When in a false state, it signals controller 200 to test and set its lock flip-flop. |
| BSMCLR | The bus master clear line extends from the bus to controller 200. When this line is set to a true state, it causes the controller 200 to clear to zeros |

MEMORY SUBSYSTEM INTERFACE LINES

| Designation | Description |
|---|---|
| | certain bus circuits within controller 200. |
| BSDBWD | The double word line is a unidirectional line which extends from the controller 200 to bus 10. This line together with the BSDBPL line is used during read requests to indicate how many words of data and in what format are being provided by memory controller 200. During read response cycles from memory controller 200, the state of line BSDBWD indicates whether one or two words of data are being applied to bus 10. When line BSDBWD is forced to a binary ONE state, this indicates that two words are being transferred. When only one word is being transferred, line BSDBWD is forced to a binary ZERO. |
| BSDBPL | The double pull line is a bidirectional line which extends between controller 200 and bus 10. This line together with line BSDBWB indicates whether the response is the first (not the last) or the last unit of data requested. |

Bus Handshake/Timing Lines

| Designation | Description |
|---|---|
| BSREQT | The bus request line is a bidirectional line which extends between the bus and controller 200. When set to a true state, it signals the controller 200 that another unit is requesting a bus cycle. When reset to a false state, it signals controller 200 that there is no bus pending bus request. This line is forced to a true state by controller 200 to request a read second half bus cycle. |
| BSDCNN | The data cycle line is a bidirectional line which extends between the bus and controller 200. When forced to a true state, the line signals the controller 200 that a unit was granted a requested bus cycle and placed information on the bus for another unit. The controller 200 forces the line to a true state to signal that it is transmitting requested data back to a unit. Prior to this, controller 200 had requested and been granted a bus cycle. |
| BSACKR | The bus acknowledge line is a bidirectional line which extends between the bus and controller 200. When set to a binary ONE by controller 200, the line signals that it is accepting a bus transfer during a read first half bus cycle or write cycle. During a read second half bus cycle, this line when set to a binary ONE by the unit which originated the request signals the controller 200 of its acceptance of a transfer. |
| BSWAIT | The bus wait line is a bidirectional line which extends between the bus and controller 200. When set to a true or binary ONE state by controller 200, it signals a requesting unit that the controller cannot accept a transfer at this time. Thereafter, the unit will initiate successive retries until the controller 200 acknowledges the transfer. The controller 200 sets the BSWAIT line true under the following conditions:<br>1. It is busy when all queue registers are full<br>2. It is requesting a read second half cycle. |
| | 3. It is busy when placed in an initialize mode.<br>when the BSWAIT line is set to a true or binary ONE state by a unit, this signals the controller 200 that the data is not being accepted by the requesting unit and to terminate its present bus cycle of operation. |
| BSNAKR | The bus negative acknowledge line is a bidirectional line which extends between the bus and controller 200. When this line is set to a true or binary ONE state by controller 200, it signals that it is refusing a specified transfer. The controller 200 sets line BSNAKR to a true state as follows:<br>1. Memory lock flip-flop is set to a binary ONE, and<br>2. The request is to test and set the lock flip-flop (BSLOCK true and BSSHBC false)<br>In all other cases, when the memory lock flip-flop is set, controller 200 generates a response via the BSACKR line or the BSWAIT line or generates no response.<br>When the BSNAKR line is forced true by a unit, this signals controller 200 that the data is not accepted by the unit and to terminate its cycle of operation. |

Tie Breaking Control Lines

| Designation | Description |
|---|---|
| BSAUOK-BSIUOK | The tie breaking network lines extend from the bus to controller 200. These lines signal controller 200 whether units of higher priority have made bus requests. When all the signals on these lines are binary ONES, this signals controller 200 that is has been granted a bus cycle at which time it is able to force the BSDCNN line to a binary ONE. When any one of the signals on the lines is a binary ZERO, this signals controller 200 that it has not been granted a bus cycle and is inhibited from forcing line BSDCNN to a binary ONE. |
| BSMYOK | the tie breaking network line extends from controller 200 to the bus. Controller 200 forces this line to a false or binary ZERO state to signal other units of lower priority of a bus request. |

General Description of the Memory Subsystem of FIG. 1

FIG. 3 shows a preferred embodiment of a memory subsystem 20-1 including a controller 200-1 which is constructed using the principles of the present invention. Referring to FIG. 1, it is seen that the controller 200-1 controls the two 256K word memory module units 210-2 and 210-4 of memory section 210. The module units of blocks 210-2 and 210-4 include high speed MOS random access memory integrated circuits corresponding to blocks 210-20 and 210-40, and address buffer circuits corresponding to blocks 210-22 through 210-26 and 210-42 through 210-46. Each 256K memory unit is constructed from 64K word by 1-bit dynamic MOS RAM chips illustrated in greater detail in FIG. 4c. More specifically, referring to FIG. 4c, it is seen that each 256K by 22-bit memory module includes 88, 65,534 (64K) word by 1-bit chips. Within each chip there are a number of storage arrays organized in a matrix of 256 rows by 256 columns of storage cells.

The controller 200-1 includes those circuits required to generate memory timing signals, perform refresh operations, control operations, data transfer operations, address distribution and decoding operations and bus interface operations. Such circuits are included as part of the different sections of FIG. 3.

The sections include a timing section 204, a refresh control section 205, a data control section 206, an address section 207, a read/write control section 208, a data in section 209, a bus control circuit section 211, a memory initialize circuit section 212 and a bus driver/receiver circuit section 213.

The bus control section 211 includes the logic circuits which generate signals for generating and accepting bus cycle requests for single and double word operations. As seen from FIG. 3, these circuits as well as the circuits of the other sections are connected to the bus via the driver/receiver circuits of section 213 which are conventional in design. The section 211 includes the tie breaking network circuits which resolve request priority on the basis of a unit's physical position on the bus. The memory controller 200-1 of FIG. 1, located at the left most or bottom position of bus 10, is assigned the highest priority while a central processing unit (CPU) 40, located at the highest most or top position of the bus is assigned the lowest priority. For further information regarding bus operation, reference may be made to U.S. Pat. No. 4,000,485 which issued Dec. 28, 1976.

Figure 4A:
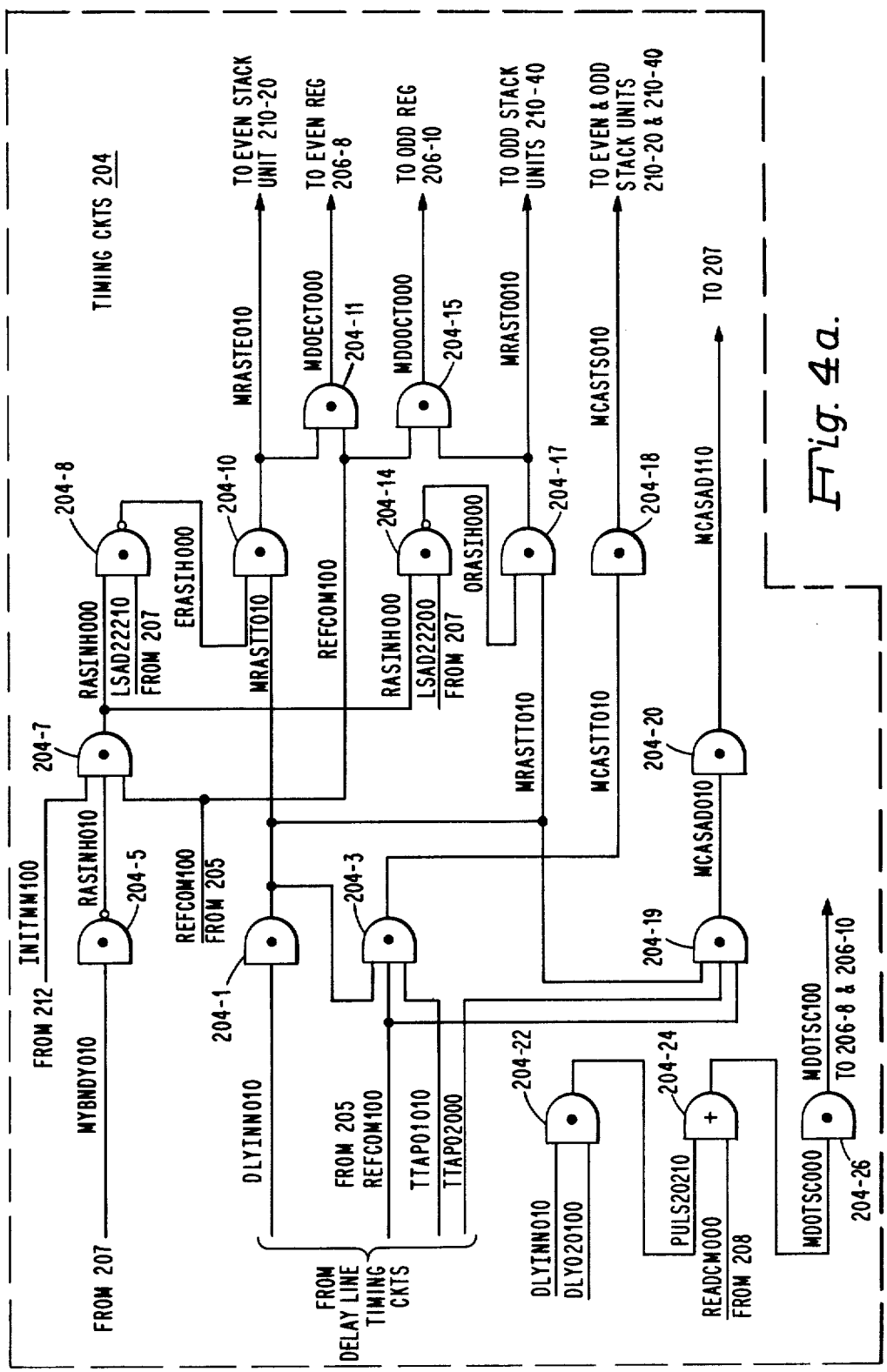

The timing section 204, shown in detail in FIG. 4a, includes circuits which generate the required sequence of timing signals from memory read and write cycles of operation. As seen from FIG. 3, this section transmits and/or receives signals to and from sections 205, 206, 207, 208, 211, 213 and 215.

The address section 207, shown in greater detail in FIG. 4b, includes circuits which decode, generate and distribute address signals required for refresh operations, initialization and read/write selection. The section 207 receives address signals from lines BSAD00-BSAD23 and BSAP00 in addition to the memory reference control signal from the BSMREF line. Additionally, section 207 receives control and timing signals from sections 204, 205, 212 and 215.

The memory initialization section 212 includes circuits, conventional in design, for clearing the controller circuits to initial or predetermined state.

The read/write control section 208 includes register and control logic circuits, conventional in design. The register circuits receive and store signals corresponding to the states of the BSWRIT, BSBYTE, BSDBPL, BSDBWD and BSAD23 lines. The control circuits decode the signals from the register circuits and generate signals which are applied to sections 204, 207 and 210 for establishing whether the controller is to perform the read, write or read followed by a write cycle of operation (i.e., for a byte command).

The refresh section 205 includes the circuits for periodically refreshing the contents of the memory. Section 205 receives timing and control signals from section 204 and provides refresh command control signals to sections 204, 207, 208, and 212. For further details, reference may be made to U.S. Pat. No. 4,185,323 which discloses circuits for generating refresh command (REFCOM) signals.

The data in section 209 circuits of block 209-4 include a pair of multiplexer circuits and an address register which is connected to receive signals from section 206. The multiplexer circuits, conventional in design, receive data words from the two sets of bus lines BSDT00-15 and BSDT16-31 and apply the appropriate words via the sets of output lines MDIE000-015 and MDIO000-015 to the correct memory modules during a write cycle of operation. That is, multiplexer circuits are selectively enabled by signal MOWTES000 generated by an AND gate 209-10 when initialize signal INITTM310 from 212 is a binary ZERO (i.e., not in an initialize mode). The AND gate 209-10 generates signal MOWTES000 as a function of bus address bit 22 (i.e., signal BSAD22) and whether the controller is doing a write operation (i.e., signal BSWRIT). During a write operation, signal MOWTES000 selects the correct data word (i.e., the word applied to bus lines BSDT00-15 or BSDT16-31) to be applied to the correct memory unit. This enables a write operation to start on any word boundary.

During a read operation, the multiplexer circuits are conditioned to apply the module identification information received from the bus lines BSDT00-15 back to the address bus lines BSAD08-23. This is done by loading the signals applied to lines BSDT00-15 into the even data registers 206-8 of section 206. This, in turn, causes the address register latches of block 209-4 to be with the module identification information transmitted via the bus lines BSDT00-15. Since this is not pertinent to an understanding of the present invention, it will not be further discussed herein.

The data control section 206 includes two sets of tristate operated data registers 206-8 and 206-10, multiplexer circuits 206-16 and 206-18 with associated control circuits which enable data to be written into and/or read from the even and odd memory units 210-20 and 210-40 of section 210. For example, during a double wide read cycle of operation, operand or instruction signals are read out from the units 210-20 and 210-40 into the even and odd output registers 206-8 and 206-10. During a write cycle of operation, signals MDIE000-15 and MDIO000-15 are loaded into the left most section of the pair of registers 206-8 and 206-10 from the bus via section 209-4 and written into the odd or even unit of section 210.

The controller 200-1 includes error detection and correction (EDAC) apparatus wherein each word contains 16 data bits and 6 check bits used to detect and correct single bit errors in the data words and detect and signal without correction, double bit errors in the data word. The EDAC apparatus includes two sets of EDAC encoder/decoder circuits 206-12 and 206-14. These circuits may take the form of those circuits disclosed in U.S. Pat. No. 4,072,853 which issued Feb. 7, 1978. Additionally, the section 206 enables a return of identification information received from the data lines BSDT00-15 and stored in register 209-4 via the address lines BSAD08-23.

For completeness, queue control section 215 has also been included as part of controller 200-1. This section includes circuits for storing address and control information for concurrently processing a plurality of memory requests. As seen from FIG. 3, section 215 receives control signals from sections 204, 205, 207, 211 and 212. The section provides control signals to sections 204, 206, 207 and 208, as shown. Since the operation of this section is not pertinent to an understanding of the present invention, it will not be disclosed in greater detail herein.

Pertinent portions of the above sections will now be discussed in greater detail with reference to FIGS. 4a through 4c.

DETAILED DESCRIPTION OF CONTROLLER SECTIONS

Only those sections which are believed necessary to an understanding of the present invention are described herein. For further information regarding the remaining sections, reference may be made to the related patent applications or to U.S. Pat. No. 4,185,323.

Section 204 and Section 206

FIG. 4a illustrates in greater detail, the timing circuits of section 204. The circuits receive input timing pulse signals DSYINN010, TTAP01010 and TTAP02010 from delay line timing generator circuits, not shown, conventional in design. Such circuits may take the form of the timing generator circuits shown in U.S. Pat. No. 4,185,323. The timing generator circuits generate a series of timing pulses via a pair of series connected 200 nanosecond delay lines in response to the signal MYACKR010 being switched to a binary ONE. These pulses in conjunction with the circuits of block 204 establish the timing for the remaining sections during a memory cycle of operation.

Additionally, the circuits of block 204 receive a boundary signal MYBNDY010 and address signals LSAD22200 and LSAD22210 from section 207. Also, section 212 applies an initialize signal INITMM100 to section 204. The signal MYBNDY010 is applied to a NOR gate 204-5 which forces signal RASINH010 to a binary ZERO when forced to a binary ONE. The series connected AND gate 204-7 logically combines initialize signal INITMM100, refresh command signal REF-COM100 generated by circuits within section 205, not shown, to produce signal RASINH000. A NAND gate 204-8 combines signals RASINH000 and address signal LSAD22210 to produce an even row strobe inhibit signal ERASIH000. The signal is applied to an AND gate 204-10 for combining with a timing signal MRASTT010 derived from signal DLYINN010 via an AND gate 204-1. The result output signal MRAS-TE010 is applied to the RAS timing input of the even stack units 210-20.

A NAND gate 204-14 combines signals RASINH010 and LSAD22200 to produce an odd row inhibit signal ORASIH000. This signal is combined in an AND gate 204-17 with timing signal MRASTT010 to generate row timing signal MRAST0010. This signal is applied to the RAS timing input of the odd stack units 210-40.

As seen from FIG. 4a, an AND gate 204-11 applies a timing signal MDOECT000 to a G input terminal of the middle section of even data register 206-8 in the absence of a refresh command (i.e., signal REFCOM000=1). Similarly, an AND gate 204-15 applies a timing signal MDOOCT000 to a G input terminal of the middle section of odd data register 206-10. AND gate 204-3 combines signals MRASTT010, REFCOM100 and TTAP01010 to generate timing signal MCASTT010. The signal MCASTS010 is applied via AND gate 204-18 to the CAS timing input of the even and odd stack units 210-20 and 210-40.

In a similar fashion, the AND gate 204-19 generates timing address signal MCASAD010. The signal MCASAD110 is applied via AND gate 204-20 to the address circuits of section 207.

The even and odd data registers 206-8 and 206-10 are tristate operated. More specifically, the registers are constructed from D-type transparent latch circuits such as those designated SN74S373 manufactured by Texas Instruments Incorporated. The register circuits are transparent meaning that while the signal applied to the G input terminal is a binary ONE, the signals at the Q output terminals follow the signals applied to the D input terminals. That is, when the signal applied to the G input terminal goes low, the signal at Q output terminal latches.

The output terminals of registers 206-8 and 206-10 are connected in common in a wired OR arrangement for enabling the multiplexing of the pair of data word signals. Such multiplexing is accomplished by controlling the states of the signals MQ2ELB000, MQ1ELB000, MDOTSC000 and MDRELB000 applied to the output control (OC) input terminals of the different sections of registers 206-8 and 206-10 shown in FIG. 3. This operation is independent of the latching action of the register flip-flops which takes place in response to the signals applied to the G input terminals.

The series connected group of gates 204-22 through 204-26 control the states of signals MDOTSC100 and MDOTSC010. The AND gate 204-22 receives timing signals DLYINN010 and DLY020100 at the beginning of a read or write cycle for enabling the storage of identification information from the bus. Since this is not pertinent to an understanding of the present invention, signal PULS20210 can be considered to be at a binary ZERO state. During a read operation, read command signal READCM000 is forced to a binary ZERO which causes AND gate 204-26 to force signal MDOTSC100 to a binary ZERO.

The signal MDOTSC100, when a binary ZERO, enables the middle sections of registers 206-8 and 206-10 to apply their contents to their output terminals. During a write cycle, when read command signal READCM000 is forced to a binary ONE, AND gate 204-26 forces signal MDOTSC100 to a binary ONE. This produces the opposite result to that described. That is, signal MDOTSC100 inhibits the middle sections of registers 206-8 and 206-10 from applying their contents to their output terminals.

The left most sections of registers 206-8 and 206-10 are enabled to apply their contents to their output terminals when signal MDRELB000 is a binary ZERO. Signal MDRELB000 for the purposes of the present invention can be considered to be in a binary ONE state. Thus, the right most sections of the registers are inhibited from applying their contents to their output terminals.

The left two most sections of registers 206-8 and 206-10 are controlled by the states of signals MQ1ELB000 and MQ2ELB000 which are generated by section 215. Signal MDOTSC000 when a binary ZERO enables one of the two left most sections of either register 206-8 or 206-10 as a function of the states of signals Q1TRST010 and Q2TRST000 from section 215. When signal Q1TRST010 is a binary ONE, signal Q2TRST000 is a binary ZERO and section 215 forces signal MQ1ELB000 to a binary ZERO. This enables the Q1 section of registers 206-8 and 206-10 to apply their contents to their output terminals. Conversely when signal Q1TRST010 is a binary ZERO, signal Q2TRST000 is a binary ONE and section 215 forces signal MQ1ELB000 to a binary ZERO. This enables the Q2 sections of registers 206-8 and 206-10 to apply their contents to their output terminals.

Section 207

FIG. 4b illustrates the different sections of address section 207. As shown, section 207 includes an input address section 207-1, an address decode section 207-2 and an address register section 207-4.

Sections 207-1 and 207-2

The input address section 207-1 includes a register 207-12 for storing the least significant bus address bit 22 and the high order chip select address bits 4 and 5. The three signals are loaded into the register 207-12 when address strobe signal ADDSTR000 is forced to a binary ZERO. This occurs when the memory becomes busy (i.e., accepts a bus cycle/a memory request).

The three address signals are shown as being received from bus 10 via the receiver circuits of block 213 for ease of explanation. That is, these address signals could have as a source, the queue address registers included as part of section 207. For further information regarding such queuing arrangement, reference may be made to the copending patent application of Robert B. Johnson and Chester M. Nibby, Jr. titled "A Memory Controller with Interleaved Queuing Apparatus," Ser. No. 202,821, filed on Oct. 31, 1980 and assigned to the assignee as named herein.

The section 207-1 also includes the boundary detection circuits of block 207-15. The circuits include a NAND gate 207-16 which connects to the D input terminal of a D-type flip-flop 207-19 via an AND gate 207-18. The NAND gate 207-16 receives memory request address bits 22-19 from bus 10. The gate 207-16 forces output detected boundary signal DBSA16000 to a binary ZERO when address bits 22-19 are all binary ONES. In all other cases, signal DBSA16000 is a binary ONE. Signal BSDBWD110 is a binary ONE when a double word transfer is being performed. Signal DBSA16000 when a binary ONE, causes AND gate 207-18 to force signal BOUNDY110 to a binary ONE causing flip-flop 207-19 to switch to a binary ONE. This forces signal MYBNDY010 to a binary ONE indicating the absence of any boundary condition. When signal DBSA16000 switches to a binary ZERO, this forces signal BOUNDY110 to a binary ZERO causing flip-flop 207-19 to switch from a binary ONE to a binary ZERO. The signal MYBNDY010 is applied as an input to timing section 204.

As shown, the high order address bit signals LSAD05210 and LSAD04210 are applied to the input terminals of a binary decoder circuit 207-20. The least significant bit address signal LSAD22210 and its complement signal LSAD22200 generated by an inverter circuit 207-22 are applied to sections 204 and 206.

The binary decoder 207-20 is enabled for operation by the grounding of a gate (G) terminal. Each of the four decode outputs DECOD0000 through DECOD3000 connects to a different pair of the NAND gates 207-24 through 207-30. It will be noted that the zero decode signal DECOD0000 connects to the input of NAND gate 207-24 which generates the 0 row address strobe signal DRAST0010. Similarly, the 1 decode signal DECOD1000 connects to the input of NAND gate 207-26 which generates the 1 row address strobe signal DRAST1010. The next sequential decode signal DECOD2000 connects to the NAND gate 207-28 which generates the next sequential row address strobe signal DRAST2010. Lastly, the last decode signal DECOD3000 connects to NAND gate 207-30 which generates the last row address strobe signal DRAST3010.

Also, these gates receive signal OVRDEC000 from an AND gate 207-32. When signal OVRDEC000 is a binary ZERO, this forces each of the signals DRAST0010 through DRAST3010 to a binary ONE state when either REFCOM100 or INITMM100 is in the ZERO state.

As shown, the even and odd row address strobe signals are applied to the RAM chips of the even and odd stack units 210-20 and 210-40.

Section 207-4

The address register section 207-4 as shown in FIG. 4b receives the bus address signals BSAD06210 through BSAD22210 applied via the queue address registers of section 207 as inputs to different stages of a row address register 207-40, a column address register 207-42 and an adder circuit 207-54.

The enabling gate input terminals of registers 207-40 and 207-42 are connected to receive a memory busy signal MEMBUZ010 from section 204. The OC input terminal of row address register 207-40 is connected to receive a timing signal MRASCT000 generated by an AND gate 207-44, an inverter circuit 207-46 and a NAND gate 207-47 in response to signals INITMM000, REFCOM000 and MCASAD110. The OC input terminal of column address register 207-42 is connected to receive a timing signal MCASCT000 generated by NAND gate 207-50 in response to signals INTREF000 and MCASAD110. The signal INTREF000 is generated by AND gate 207-44 which receives signals INITMM000 and REFCOM000.

Each of the address registers 207-40 and 207-42 is constructed from D-type transparent latch circuits such as those designated as SN74S373 previously discussed. As seen from FIG. 4b, the different address output terminals of the registers of each set are connected in common in a wired OR arrangement for enabling the multiplexing of these address signals. As previously described, such multiplexing is accomplished by controlling the state of the signals applied to the output control (OC) input terminals of the registers 207-40 and 207-42.

More specifically, the output control (OC) terminals enable so-called tristate operation which is controlled by the circuits 207-44 through 207-50. When each of the signals MRASCT000 and MCASCT000 is in a binary ONE state, this inhibits any address signals from being applied at the Q output terminals of the register associated therewith. As mentioned, this operation is independent of the latching action of the register flip-flops.

Additionally, in the preferred embodiment of the present invention, section 207-4 includes a 3-bit binary full adder circuit 207-54, convention in design which connects in parallel with address registers 207-40 and 207-42. The adder circuit 207-54 is connected to increment by one, the low order address bits 19 through 21. In greater detail, the input terminals A1-A4 receive bus address signals BSAD21210, BSAD20210 and BSAD19210 from the queue address registers of section 207. Binary ZERO signals are applied to input terminals A8 and B1-B8. The least significant address signal BSAD22210 is applied as a carry in signal to adder terminal C0 as shown. As mentioned previously, the bus address signals can have as its source, the queue address registers of section 207.

The incremented output signals MADD00111 through MADD02111 appearing at adder sum terminals S1-S4 are applied to one set of input terminals of a multiplexer circuit 207-56. A second set of input terminals multiplexer 207-56 are connected to receive the address signals BSAD11210, BSAD12210 and BSAD13210 from the queue address registers of section 207. This eliminates register delays. The multiplexer circuit 207-56 is enabled by connecting an enable (EN) terminal to ground. The signal MCASAD110 from section 204 applied to a gate (G0/G1) terminal controls the selection of the source of address signals applied to the output terminals of multiplexer circuit 207-56. That is, when signal MCASAD110 is a binary ZERO, address signal BSAD11210, BSAD12210 and BSAD13210 are the source of signals MADD00211 through MADD02211. When signal MCASAD110 is a binary ONE, adder signals MADD00111 through MADD02111 are the source of signals MADD00211 through MADD02211.

Figure 4C:
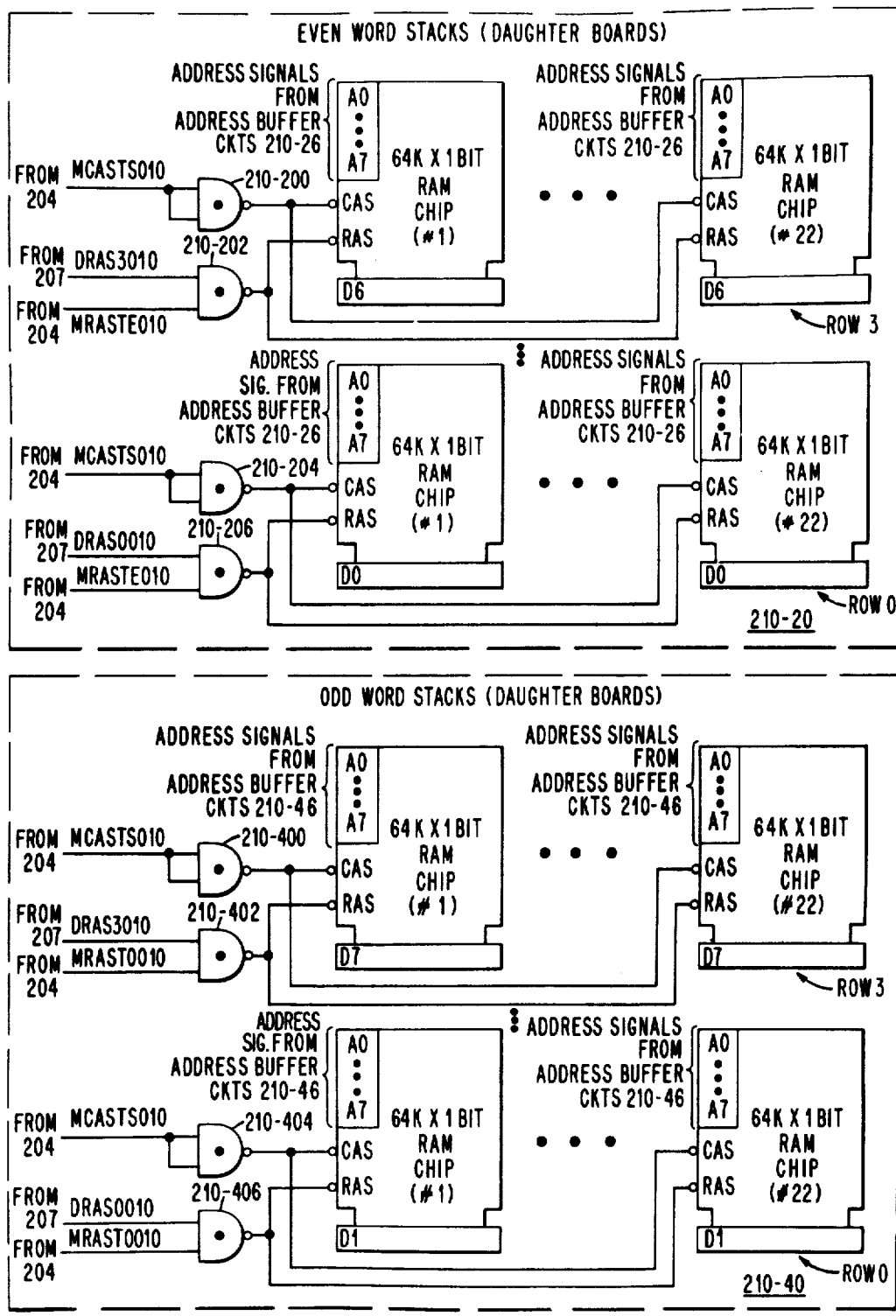

The odd stack RAM chips of FIG. 4c are connected to receive the address signals MADD0010 through MADD07010 via address buffer circuits 210-46. The even stack RAM chips of FIG. 4c are connected to receive address signals MADD0010 through MADD07010 via address buffer circuits 210-26 when signal MCASAD110 is a binary ZERO. When signal MCASAD110 is a binary ONE, the incremented output signals MADD00111 through MADD02111 are applied to the even stack RAM chips in lieu of signals MADD00010 through MADD02010 together with signals MADD03010 through MADD07010.

Memory Units 210-20 and 210-40—FIG. 4c

As previously discussed, the even word and odd word stack of blocks 210-20 and 210-40 are shown in greater detail in FIG. 4c. These stacks include four rows of 22, 64K × 1-bit RAM chips as shown. Each 64K chip includes two 32,768 bit storage arrays. Each array is organized into a 128 row by 256 column matrix and connects to a set of 256 sense amplifiers. It will be appreciated that other 64K chip organizations may also be utilized. The chips and associated gating circuits are mounted on a daughter board.

Each daughter board includes two inverters, not shown, which are connected to receive a corresponding one of the read/write command signals from section 208 and four, two input NAND gates (e.g. 210-200 through 210-206 and 210-400 through 210-406) which are connected to receive the row and column timing signals from section 204 and the row decode signals from section 207. Only those chip terminals pertinent to an understanding of the present invention are shown. The remaining terminals, not shown, are connected in a conventional manner. For further information, reference may be made to the copending patent application "Rotating Chip Selection Technique and Apparatus," invented by Chester M. Nibby, Jr. and William Panepinto, Jr., Ser. No. 921,292, filed on July 3, 1978 now U.S. Pat. No. 4,296,467 issued on Oct. 20, 1981 and assigned to the same assignee as named herein.

DESCRIPTION OF OPERATION

Figure 5:
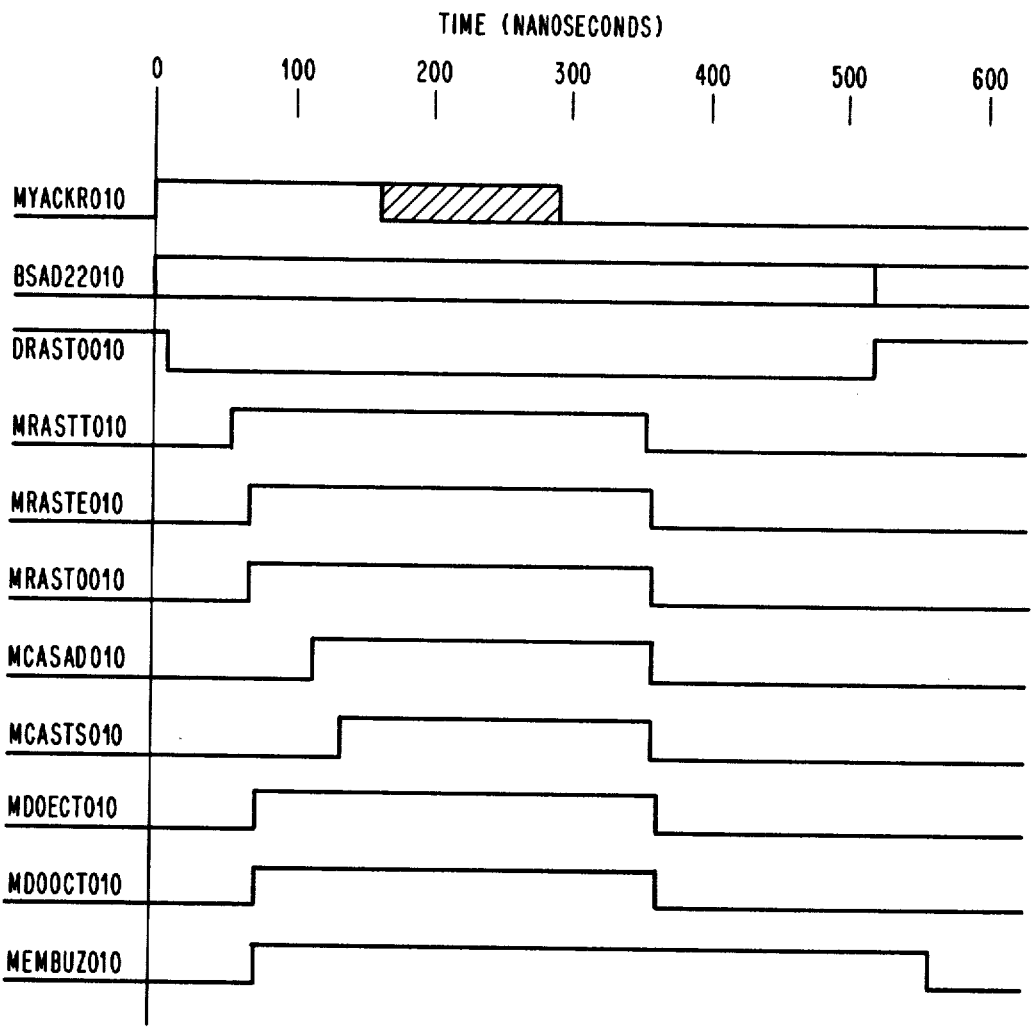
FIG. 5 is a timing diagram used in describing the operation of the present invention.
Figure 6A:
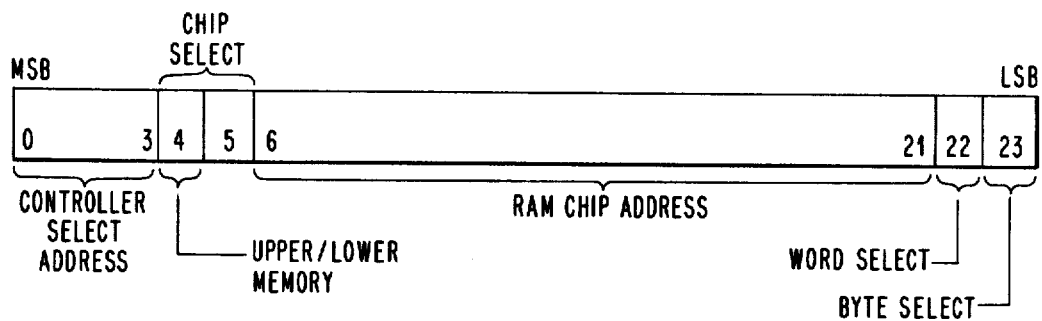
FIG. 6a illustrates the format of the address applied to the memory subsystem of FIG. 1.
Figure 6B:
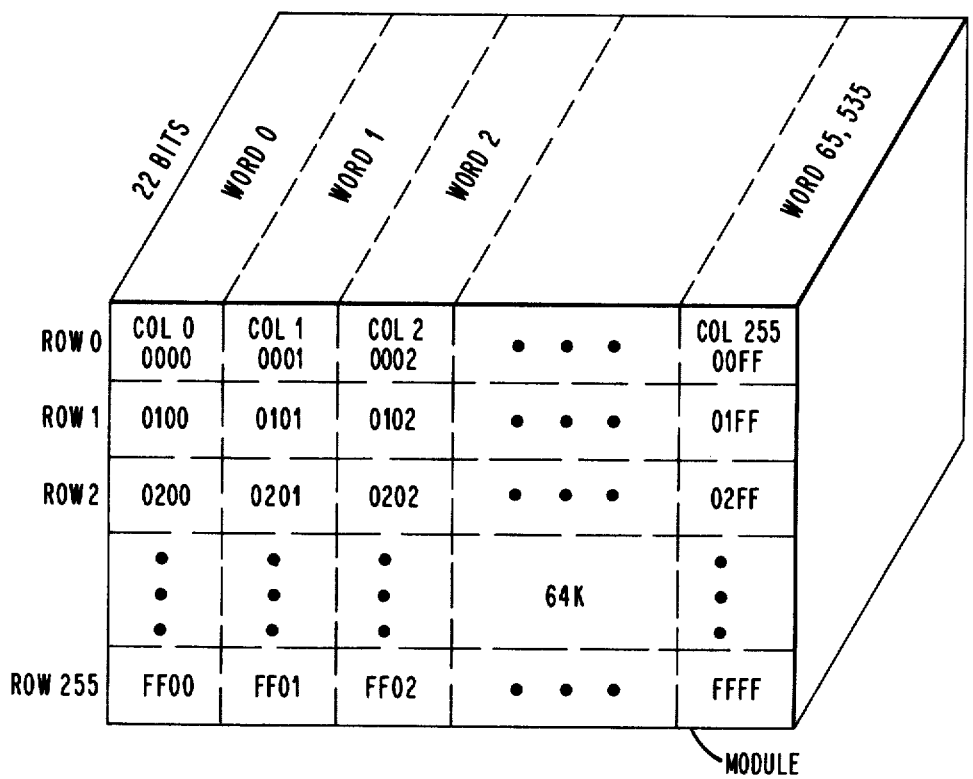
FIG. 6b illustrates the organization of a memory module of FIG. 1.
Figure 6C:
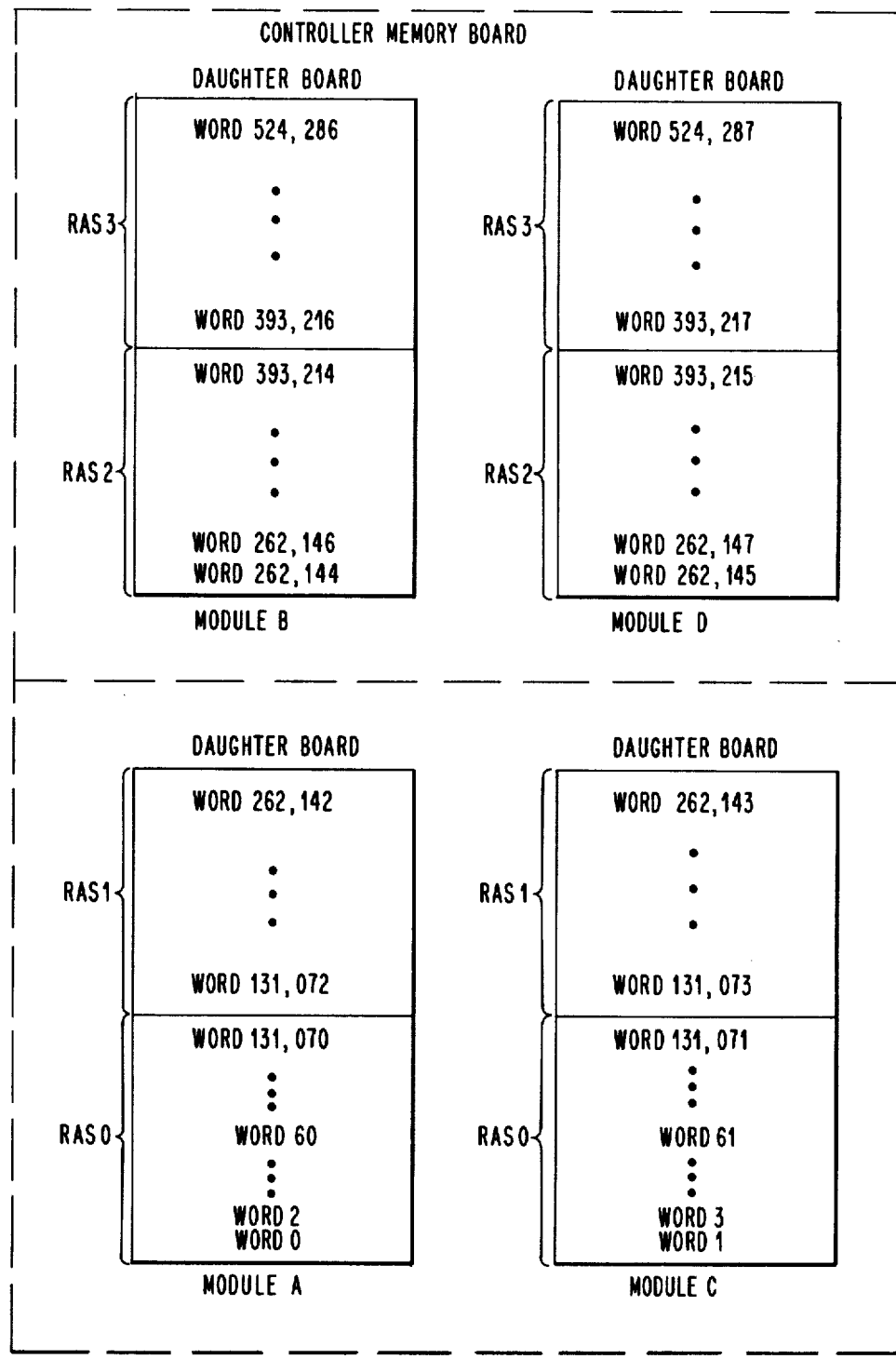
FIG. 6c illustrates the organization of memory modules of FIG. 1.

With reference to FIGS. 1-6c, the operation of the preferred embodiment of the present invention will now be described with particular reference to the timing diagram of FIG. 5. It will be assumed that each of the units 210-2 and 210-4 include four 128K modules as shown in FIGS. 1, 4c and 6c. It will be obvious that each of the units 210-2 sand 210-4 can include any number of stack units with the provision that both of the units 210-2 and 210-4 include the same number of stack units.

Before discussing an example of operation with reference to FIG. 5, reference is first made to FIGS. 6a and 6b. FIG. 6a illustrates the format of the memory addresses applied to the memory subsystem as part of each memory read or write request. The high order/most significant bit positions are coded to identify the memory module/controller to process the requests. Address bit 4 is used to select which 256K half (i.e., upper or lower half) of controller memory is being accessed. Additionally, address bit 4 and address bit 5 are coded to specify the row of chips selected for access. These address bits are processed by the circuits of memory subsystem 20-1 and are not provided to the RAM chips.

Address bits 6-21 specify the address of the pair of 22-bit storage locations within the RAM chips of a pair of modules being addressed. As explained in greater detail herein, these 16 address bits are multiplexed into eight address inputs and applied via the address buffer circuits of blocks 210-26 and 210-46 to the address input terminals A0-A7 of the RAM chips of FIG. 4c. The least significant address bits 22-23 as shown specify which word of the pair and byte within an addressed word.

FIG. 6b illustrates the basic word organization of each of the modules of FIG. 6c. Sequential addresses in hexidecimal form are allocated to the different word storage locations of the module as shown. That is, from FIG. 6c, it is seen that the address (0000) is assigned to the word location at row 0, column 0. The next sequential address (0001) is assigned to the word location at row 0, column 1, etc. Thus, addressing proceeds sequentially along the columns of the chip arrays rather than along the rows. As explained herein, this enables address incrementing to proceed in parallel with addressing.

FIG. 6c illustrates the word memory organization of modules A through D of FIG. 1. As shown, the first 256K words are provided by modules A and C. The next 256K words are provided by modules B and D. These pairs of modules are selected as a function of the state of address bit 4, as previously mentioned. FIGS. 6b and 6c will be referenced to explain the manner in which the apparatus of the present invention achieves sequential word addressing in the presence of subboundary conditions.

FIG. 5 illustrates diagrammatically the relationships between the different timing and control signals generated by the circuits of sections 207 and 204 during a single memory cycle of operation. From FIG. 5, it is seen that the various signals shown are referenced with respect to signal MYACKR010 which starts a memory cycle of operation. It is assumed that subsystem 20 receives a memory command which includes an address having the format of FIG. 6a. This results in the switching of signal MYACKR010 to a binary ONE. The signal MYACKR010 causes the circuits of block 204 to force the memory busy signal MEMBUZ010 to a binary ONE indicating that the memory subsystem has begun a memory cycle of operation (i.e., memory is busy).

In response to the memory busy signal MEMBUZ010, the bus address signals BSAD06210 through BSAD21210 are loaded into row address register 207-40 and column address register 207-42. That is, signals BSAD07210 through BSAD13210 and BSAD18210 are loaded into row address register 207-40. Signals BSAD14210 through BSAD17210, signals BSAD19210 through BSAD21210 and signal BSAD06210 are loaded into column address register 207-42. Also, signal MEMBUZ010 switches signal ADDSTR000 of FIG. 4b to a binary ZERO. This loads the least significant address bit BSAD22110 and chip select address signals BSAD04110 and BSAD05110 into register 207-12.

As seen from FIG. 4b, the stored address signals LSAD04210 and LSAD05210 are decoded by decoder circuit 207-20. By way of example, it is assumed that the address bits 4-21 are all ZEROS. Accordingly, the decoder circuit 207-20 forces the zero decode signal DECOD0000 to a binary ZERO. This signal conditions NAND gate 207-24 to force signal DRAST0010 to a binary ONE.

As seen from FIG. 4c, the signal DRAST0010 is applied as one input of NAND gate 210-206 of the even word stack 210-20. The same signal DRAST0010 is also applied as one input of NAND gate 210-406 of the odd word stack 210-40. When the timing signals MRASTE010 and MRAST0010 are generated, the NAND gates 210-206 and 210-406 force their outputs to binary ZEROS. This, in turn, results in the storing of the row address signals from row address register 207-40 applied via the address buffer circuits to the terminals A0-A7 of both rows of RAM chips within stacks 210-20 and 210-40.

In greater detail, the timing circuits of FIG. 4a in response to signal MYACKR010 begin a cycle of operation during which timing signals DLYINN010, TTAP01010 and TTAP02010 are generated. These signals cause gates 204-1, 204-3, 204-10, 204-17, 204-19 and 204-20 to generate signals MRASTT010, MCASTT010, MRASTE010, MRAST0010, and MCASAD010, respectively, at the times shown in FIG. 5. As mentioned, the row timing signals MRASTE010 and MRAST0010 together with row decode signal DRAST0010 generate even and odd row address strobe signals which are applied to the RAS terminals of both rows of RAM chips.

At that time, column address signals MCASTT010 and MCASAD010 are binary ZEROS.

From FIG. 4b, it is seen that the output signal MRASCT000 from NAND gate 207-47 is a binary ZERO at this time (i.e., when signal MCASAD110 is a binary ZERO). This conditions row address register 207-40 to apply the all ZERO bus address signals at its inputs to its output terminals. From there, the address signals MADD00010-MADD07010 are applied to the odd stack address buffer circuits 210-46.

As seen from FIG. 4b, the high order three row address bits are also applied to the even stack address buffer circuits 210-26. That is, since column address signal MCASAD110 is a binary ZERO, these signals are applied via multiplexer circuit 207-56. The remaining address signals MADD03010-MADD07010 are directly applied to the even stack address buffer circuits 210-26 as shown. Accordingly, both rows of RAM chips latch or store the 8-bit all ZERO row address signals applied to the A0-A7 terminals.

It will be noted that during RAS time, the adder circuit 207-54 performs the appropriate incrementing operation upon the low order three address bits (i.e., least significant chip address bits A0-A2) as a function of the state of least significant address bit 22. Since bit 22 is a binary ZERO, the low order three address bits pass through adder circuit 207-54 unincremented. Thus, prior to CAS time, the result generated by adder 207-54 is present at the input of multiplexer circuit 207-56.

As seen from FIG. 4a, signal MCASAD010 causes gate 204-20 to generate signal MCASAD110 at the time shown in FIG. 5. The signal MCASAD110 is applied to NAND gate 207-50 and multiplexer circuit 207-56. The binary ONE signal MCASAD110 causes multiplexer circuit 207-56 to select the address signals applied to the second set of input terminals.

In greater detail, when signal MCASAD010 switches to a binary ONE, signal MCASAD110 switches to a binary ONE. The result is that the bus address signals BSAD0620 and BSAD14210 through BSAD21210 are applied to the output terminals of register 207-42. At the same time, register 207-40 is inhibited from applying bus address signals to its output terminals. From there, the column address signals MADD00010 through MADD07010 are applied to the odd buffer circuits 210-46. The incremented low order address bits are applied via multiplexer circuit 207-56 to the even buffer circuits 210-26. The remaining column address signals MADD0310-MADD07010 are directly applied to the even buffer circuits 210-26.

As seen from FIG. 4a, timing signal MCASTT010 causes gate 204-18 to generate signal MCASTS010 at the time shown in FIG. 5. The signal MCASTS010 is applied via NAND gates 210-200, 210-204, 210-400 and 210-406. This results in a column address strobe signal being applied to the CAS terminals of the rows of RAM chips. Accordingly, all of the RAM chips store the 8-bit all ZERO column signals applied to the A0-A7 terminals.

In the example under consideration, the all ZERO memory address causes the contents of the storage locations of memory modules A and C of FIG. 6c defined by the ZERO row and column address values storing word 0 and word 1 to be accessed. This results in word 0 and word 1 being loaded into the even data and odd data registers 206-8 and 206-10, respectively, in response to signals MDECT000 and MDOCT000 of FIG. 5. The even data and odd data registers 206-8 and 206-10 are enabled by signal MDOTSC100, a binary ZERO, to apply the input data signals to their output terminals.

From there, word 0 and word 1 are aplied to lines MUXD00-15 and MUXD16-31 of FIG. 3 via the data out multiplexer circuits 206-16 and 206-18 as a function of the state of the least significant address bit LSAD22. That is, when signal LSAD22210 is a binary ZERO, the contents of the even data register 206-8 is applied to lines MUXD00-15 by multiplexer circuit 206-16. The multiplexer circuit 206-18 applies the odd data register contents to lines MUXD16-31. The reverse of this occurs when address bit LSAD22210 is a binary ONE. In this manner, access to both memory module units can occur without regard to word boundaries. As seen from FIG. 5, the memory cycle of operation is completed when the circuits of section 204 switch the memory busy signal MEMBUZ010 to a binary ZERO.

For the zero values of least significant address bit 22, the RAM chip address bits 6-21 are the same. However, when the least significant address bit has the value "one", this creates a subboundary address condition. That is, when the memory request address specifies that location 1 is to be accessed, again an all ZERO address would be stored in row and column address registers 207-40 and 207-42. Without adder 207-54, words 1 and 0 are accessed. However, it is desired that words 1 and 2 from modules C and A be accessed and read out to multibus 10. In order to accomplish the accessing of the desired word pair, adder circuit 207-54 is conditioned to increment by one the column address applied to the RAM chips of the even memory unit 210-20.

In greater detail, when signals BSAD04110 and BSAD05110 are binary ZEROS, this causes decoder circuit 207-20 to force the "0" decode output signal DECOD0000 to a binary ZERO. This, in turn, causes NAND gate 207-24 to force signal DRAST0010 to a binary ONE.

Accordingly, signal DRAST0010 with timing signals MRAST0010 and MRASTE010 load the row address signals applied to the A0-A7 terminals into the RAM chips of rows 0 of memory units 210-20 and 210-40 of FIG. 4c. However, it will be noted that during RAS time, the column address signals aplied to the A0-A2 terminals are incremented by one by adder circuit 207-54 when the least significant address bit 22 has the value "1". The incremented column address is applied to the even rows of RAM chips via multiplexer 207-56. The RAM chips of all of the rows of the odd memory unit 210-40 receive the unincremented column address signals.

Accordingly, words 1 and 2 of modules C and A of FIG. 6c are accessed and read out to bus 10 via multiplexer circuits 206-16 and 206-18 as a function of the state of least significant address bit 22. As seen from FIG. 6b, the first word located at row 0, column 0, is accessed from module C while the second word located at row 0, column 1, is accessed from module A. It will be appreciated that the next several word pairs are accessed in the manner described above. As seen from FIG. 6b, by incrementing the odd memory request addresses received from bus 10, the desired words having different column addresses within module A are accessed.

Addressing proceeds as such until the memory request address specifies word 15. At this point, the range of the adder circuit 207-54 is exceeded. Since it is not possible to provide the correct column address, the boundary circuits of block 207-15 are operative to detect the boundary address condition and switch signal MYBNDY010 to a binary ZERO. That is, the all ONES value of bus address bits 22-19 causes NAND gate 207-16 to switch to a binary ZERO. This switches flip-flop 207-18 to a binary ZERO state.

From FIG. 4a, it is seen that signal MYBNDY010 forces signal RASINH000 to a binary ONE. This conditions NAND gates 204-8 and 204-14 to generate row address strobe inhibit signals ERASIH000 and ORASIH000 as a function of the state of least significant address bit 22. Since bit 22 is a binary ONE, signal LSAD222000 is a binary ZERO which causes NAND gate 204-14 to switch signal ORASIH000 to a binary ONE. At the same time, NAND gate 204-8 switches signal ERASIH000 to a binary ZERO.

The above causes timing section 204 to generate only those timing signals required for accessing odd memory module 210-40. That is, AND gate 204-17 generates timing signal MRAST0010 which causes the row address to be latched into the rows of RAM chips of memory module C. This is followed by the latching of the column address. Thereafter, the contents of storage location 15 defined by the row and column address is accessed and stored in odd data register 206-10 in response to timing signal MDOCT000 generated by AND gate 204-15. Thereafter, word 15 of module C is applied to lines MUXD00-15 and no new data is applied to lines MUXD16-31. It will be appreciated that the state of signal MYBNDY010 may also be used to signal the occurrence of the boundary condition to central processing unit 40.

Address sequencing and address decoding proceeds in the above manner until the location corresponding to 256K is reached. From that point on, bus address bit 4 is switched to a binary ONE. As seen from FIG. 6c, this causes decoder circuit 207-20 to generate signals DRAST2010 and DRAST3010 for accessing the next 256K locations.

The extension of each subboundary address condition and the detection of an address boundary condition every 16 words proceed as described previously. The only difference is that the rows of RAM chips of modules B and D are enabled instead of modules A and C using signals DRAST2010 and DRAST3010 instead of signals DRAST0010 and DRAST1010.

From the above, it is seen how the addressing apparatus of the present invention is able to provide simultaneous access to a plurality of sequential word locations during a single bus cycle of operation. Accessing is accomplished by having the addressing apparatus increment each odd column address as a function of the least significant address bit of each request during the interval the row address portion of the memory request address is being transferred and stored within the same row of chips within the plurality of memory modules. This allows data words to be delivered to a requesting device within a minimum of time. The addressing apparatus includes a minimum of storage registers and operates without any adverse effect on memory system performance. The arrangement of the invention also permits double word access to start with even or odd word addresses in the case of read/write operations and with a minimum of circuits.

It will be appreciated by those skilled in the art that many changes may be made to the illustrated embodiment. For example, the arrangement of this invention can be utilized with the addressing arrangement of the patent application entitled "Sequential Word Aligned Address Apparatus", invented by Robert B. Johnson, et al. When incorporated therein, this reduces address incrementing delays. Thus, the address boundary conditions may be adjusted by altering the size of the adder circuit 207-54 and modifying the boundary circuits of block 207-15.

Also, the sequential addressing apparatus of the present invention may be used with any number of memory module units and memory module units having any number of rows of chips. Accordingly, the invention may be used to access any number of storage locations within a corresponding number of memory module units.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A memory subsystem for use in a system including a processing unit coupled to a multiword bus in common with said subsystem for transfer of information therebetween during bus transfer cycles of operation, said unit being operative to generate memory requests on said bus to said subsystem, each of said requests include a multibit coded address containing row and column addresses, said subsystem comprising:

a plurality of independently addressble memory module units, each memory unit being individually coupled to said multiword bus and having a set of input address lines, said each memory unit including a plurality of rows of random access memory chips and said random access memory chips including a number of addressable arrays of memory storage devices, said arrays being divided into a number of rows and columns;

first and second multibit tristate register means coupled to said bus for storing said row and column addresses respectively of each said memory request address for transfer to said memory module units and said first and second register means being connected to each of said sets of lines of said memory module units;

increment circuit means being coupled to said bus for receiving the least significant column address bits applied in parallel to said second tristate register means, said increment circuit means being operative to modify said least significant column address bits in response to at least one of said least significant address bits during the transfer of said row address to said memory units; and selection circuit means coupled to said bus for receiving the least significant row address bits applied in parallel to said first address register means, to said increment circuit means and to said set of address lines of a predetermined one of said memory module units, said selection circuit means being operative to apply in succession said least significant row address bits and the resulting column least significant address bits produced by said increment circuit to said predetermined one of said memory module units in parallel with said row and column addresses applied from said first and second register means respectively enabling simultaneous access to a plurality of sequential storage locations within said number of said addressable arrays of said memory module units during a single bus cycle of operation.

2. The system of claim 1 wherein said subsystem further includes:

row address selection means coupled to said bus for generating row address selection signals in response to a most significant bit portion of each address, said row selection means including decoder means having a number of select input terminals connected to receive from said bus said most significant bit portion and a number of output terminals coupled to different ones of said memory module units, said decoder means being conditioned by said most significant bit portion to generate a decode output signal at one of said output terminals for enabling storage of said row address within a pair of said memory module units so as to provide said simultaneous access to said plurality of sequential storage locations.

3. The subsystem of claim 1 wherein said subsystem further includes:

timing means for generating a predetermined sequence of timing signals in response to each memory request, said timing means being coupled to said first and second tristate register means, to said selection circuit means and to said plurality of memory module units, said first register means and said selection circuit means being conditioned by a first state of one of said sequence of timing signals to apply said row address to said sets of address input lines, said selection circuit means and said second register means being conditioned by another state of said one of said sequence of timing signals to apply said column address to said sets of address input lines and said plurality of memory module units being conditioned by other ones of said timing signals to store in succession said row and column addresses in the rows of random access memory chips of said plurality of memory module units.

4. The subsystem of claim 3 wherein said subsystem further includes a plurality of data registers, each coupled to a different one of said memory module units, to said timing means and to said bus, said timing means including a first pair of gating means coupled to said bus to receive signals representative of said least significant address bit and its complement and a second pair of gating means coupled to said first pair of gating means, said second pair of gating means being conditioned by one of said other ones of said timing signals to apply signals to said plurality of data registers for enabling the read out of a plurality of sequentially addressed words to said bus during said single bus cycle of operation.

5. The subsystem of claim 4 wherein said subsystem further includes a plurality of multiplexer circuits, said multiplexer circuits being coupled to said plurality of data register means, to different word sections of said multiword bus and to said bus for receiving signals representative of said least significant address bit and said complement, said plurality of multiplexer circuits being conditioned by said coding of said least significant address bit to apply different ones of said plurality of words to said different word sections of said bus enabling a read operation to start with an odd or even word.

6. The subsystem of claim 3 wherein said selection circuit means includes a multiplexer circuit having a first set of input terminals coupled to said bus for receiving said least significant row address bits, a second set of input terminals connected to said increment circuit means and a set of output terminals connected to said set of least significant address lines, said multiplexer circuit further including a control terminal connected to said timing means for receiving said one of said sequence of timing signals, said multiplexer circuit means being conditioned by the switching of said one of said sequence of timing signals to apply in succession said row address and said column address bits to said least significant address lines of said predetermined one of said modules.

7. The subsystem of claim 6 wherein said increment circuit means includes a carry input terminal coupled to said bus to receive said one least significant address bit, said increment circuit means being operative in response to each predetermined state of said least significant address bit to increment by one, said least significant column address bits applied to said selection circuit means.

8. The subsystem of claim 6 wherein said predetermined state of said least significant address bit indicates a subboundary address condition occurring during the addressing of said sequential word storage locations and said increment circuit means being operative in response to each said predetermined state to increment said least significant column address bits for enabling the addressing of a next sequential word location.

9. The subsystem of claim 8 wherein said predetermined state corresponds to a binary "1".

10. The subsystem of claim 8 wherein said first and second address register means, each include the same predetermined number of stages and wherein said increment circuit means further includes n number of input terminals, coupled in parallel to said bus with n number of stages of said second register means which store said least significant column address bits, said increment circuit means being operative to increment by one said n number of least significant column address bits in response to said predetermined state of said least significant address bit indicating each occurrence of said subboundary address condition until said increment circuit means generates an output address sum representative of an actual boundary address condition.

11. The subsystem of claim 10 wherein said actual boundary address condition is denoted by a value which is $2^n$ times the frequency of occurrence of said subboundary address condition and wherein n is selected to have a value which extends said boundary address condition so as not to affect the performance of said memory subsystem.

12. The subsystem of claim 11 wherein said frequency of occurrence of said subboundary address condition is denoted by the value 2 specified by a binary "1" state of said least significant address bit.

13. The subsystem of claim 12 wherein n is 3 and said boundary address condition occurs in response to memory request addresses having values which are multiples of a predetermined number indicative of the number of sequential word locations which can be accessed in pairs during single cycles of operation.

14. The subsystem of claim 13 wherein said predetermined number has a value which is a multiple of 16 which extends said boundary address condition so as to permit the access of up to 16 sequential word locations.

15. The subsystem of claim 10 wherein said subsystem further includes boundary circuit means coupled to said bus to receive predetermined address bits of said memory request address, said boundary circuit means including means for generating an output boundary condition signal indicative of said boundary address condition when said predetermined address bits have a predetermined value equal to said address sum.

16. The subsystem of claim 15 wherein said boundary circuit means couples to said timing means and wherein said timing means includes a first pair of gating means coupled to receive signals representative of the least significant address bit and said complement from said bus, said first pair of gating means logically combining said output boundary condition signal with said least significant address bit and said complement for generating a pair of said other timing signals, said first pair of gating means being conditioned by said boundary condition signal to generate one of said pair of other timing signals specified by said least significant address bit for storing said row address in a row of said random access memory chips of one of said pair of memory module units enabling access of a first one of said pair of sequential word locations.

17. A memory subsystem for use in a system including a processing unit coupled to a multiword bus in common with said subsystem for transfer of information therebetween during bus transfer cycles of operation, said unit being operative to generate memory requests on said bus to said subsystem, each of said requests include a multibit coded address containing row and column addresses coded to specify a storage location within said memory subsystem to be accessed, said memory subsystem comprising:

a pair of independently addressable memory module units, each memory unit being individually coupled to said multiword bus and having a set of input address lines, said each memory unit including a plurality of rows of random access memory chips and said random access memory chips including a number of addressable arrays of memory storage devices, said arrays being divided into a number of rows and columns;

addressing means coupled to said bus to receive said multibit address of each memory request, said addressing means including:

a multibit address register for storing at least the least significant row and column address bits of each said memory request address for the duration of processing by said subsystem;

first and second multibit tristate registers coupled to said bus for storing said row and column addresses respectively of each said memory request address for transfer to said memory module units and said first and second registers being connected to each of said sets of input address lines of said memory module units;

an adder circuit being coupled to said multibit address register for receiving the least significant column address bits applied in parallel to said second tristate register, said adder circuit being operative to increment by one said column address bits in response to at least one of said least significant address bits during said transfer of said row address to said pair of memory units; and a selection circuit coupled to said multibit address register for receiving said least significant row address bits, to said adder circuit and to the least significant address lines of said set of address lines of a predetermined one of said memory module units, said selection circuit being operative to apply least significant row address bits and incremented least significant column address bits to said predetermined one of said memory module units during successive intervals in parallel with said row and column addresses applied by said first and second registers enabling simultaneous access to a plurality of sequential storage locations within said number of said addressable arrays of said memory module units during a single bus cycle of operation.

18. The subsystem of claim 17 wherein said subsystem further includes:

timing means for generating a predetermined sequence of timing signals in response to each memory request, said timing means being coupled to said first and second tristate registers, to said selection circuit and to said pair of memory module units, said first register and said select circuit being conditioned by a first state of one of said sequence of timing signals to apply said row address to said sets of address input lines during a first one of said successive intervals and said selection circuit and said second register being conditioned by another state of said one of said sequence of timing signals to apply said column address to said sets of address input lines during a second one of said successive intervals, said plurality of memory module units being conditioned by other ones of said timing signals to store in succession said row and column addresses in the rows of random access memory chips of said plurality of memory module units.

19. The subsystem of claim 18 wherein said subsystem further includes:

row address selection means coupled to said bus for generating row address selection signals in response to a most significant bit portion of each address, said row selection means including decoder means having a number of select input terminals connected to receive said most significant bit portion and a number of output terminals coupled to different ones of said memory module units, said decoder means being conditioned by said most significant bit portion to generate a decode output signal at one of said output terminals for enabling storage of said row address within a pair of said memory module units so as to provide said simultaneous access to said plurality of sequential storage locations.

20. The subsystem of claim 19 wherein said subsystem further includes a plurality of data registers, each coupled to a different one of said memory module units, to said timing means and to said bus, said timing means including a first pair of gating means coupled to said bus to receive signals representative of said least significant address bit and its complement and a second pair of gating means coupled to said first pair of gating means, said second pair of gating means being conditioned by one of said other ones of said timing signals to apply signals to said plurality of data registers for enabling the read out of a plurality of sequentially addressed words to said bus during said single bus cycle of operation.

21. The subsystem of claim 20 wherein said subsystem further includes a plurality of multiplexer circuits, said multiplexer circuits being coupled to said plurality of data register means, to different word sections of said multiword bus and to said bus for receiving signals representative of said least significant address bit and said complement, said plurality of multiplexer circuits being conditioned by said coding of said least significant address bit to apply different ones of said plurality of words to said different word sections of said bus enabling a read operation to start with an odd or even word.

22. The subsystem of claim 19 wherein said selection circuit includes a first set of input terminals coupled to said address register for receiving said least significant row address bits, a second set of input terminals connected to said adder circuit and a set of output terminals connected to said least significant address lines, said selection circuit further including a control terminal connected to said timing means for receiving said one of said sequence of timing signals, said selection circuit being conditioned by changes in the state of said one of said sequence of timing signals to apply in succession, said row address and said column address bits to said least significant address lines of said predetermined one of said modules.

23. The subsystem of claim 22 wherein said adder circuit includes a carry input terminal coupled to said multibit address register to receive said one least significant address bit, said adder circuit being operative in response to each predetermined state of said least significant address bit to increment by one, said least significant column address bits applied to said selection circuit.

24. The subsystem of claim 22 wherein said predetermined value of said least significant address bit indicates a subboundary address condition occurring during the addressing of said sequential word storage locations and said adder circuit being operative in response to each said predetermined state to increment said least significant column address bits enabling the addressing of a next sequential word location.

25. The subsystem of claim 24 wherein said predetermined state corresponds to a binary "1".

26. The subsystem of claim 24 wherein said first and second address register, each include the same predetermined number of stages and wherein said adder circuit further includes n number of input terminals, coupled in parallel to said bus with n number of stages of said second register which store said least significant column address bits, said adder circuit being operative to increment by one said n number of least significant column address bits in response to said predetermined value of said least significant address bit indicating each occurrence of said subboundary address condition until said adder circuit generates an output address sum representative of an actual boundary address condition.

27. The subsystem of claim 26 wherein said actual boundary address condition is denoted by a value which is $2^n$ times the frequence of occurrence of said subboundary address condition and wherein n is selected to have a value which extends said boundary address condition so as not to affect the performance of said memory subsystem.

28. The subsystem of claim 27 wherein said frequency of occurrence of said subboundary address condition is denoted by the value 2 specified by a binary "1" state of said least significant address bit.

29. The subsystem of claim 28 wherein n is 3 and said boundary address condition occurs in response to memory request addresses having values which are multiples of a predetermined number indicative of the number of sequential word locations which can be accessed in pairs during single cycles of operation.

30. The subsystem of claim 29 wherein said predetermined number has a value which is a multiple of 16 which extends said boundary address condition so as to permit the access of up to 16 sequential word locations.

31. The subsystem of claim 26 wherein said subsystem further includes boundary circuit means coupled to said bus to receive predetermined address bits of said memory request address, said boundary circuit means including means for generating an output boundary condition signal indicative of said boundary address condition when said predetermined address bits have a predetermined value equal to said address sum.

32. The subsystem of claim 31 wherein said boundary circuit means couples to said timing means and wherein said timing means includes a first pair of gating means coupled to receive signals representative of the least significant address bit and said complement from said multibit address register, said first pair of gating means logically combining said output boundary condition signal with said least significant address bit and said complement for generating a pair of said other timing signals, said first pair of gating means being conditioned by said boundary condition signal to generate one of said pair of other timing signals specified by said least significant address bit for storing said row address in a row of chips of one of said pair of memory module units enabling access of a first one of said pair of sequential word locations.

33. A memory subsystem for use in a system including a processing unit coupled to a multiword bus in common with said subsystem for transfer of information therebetween during bus transfer cycles of operation, said unit being operative to generate memory requests on said bus to said subsystem, each of said requests include a multibit coded address containing row and column addresses, said memory subsystem comprising:

a plurality of independently addressable memory module units, each memory unit being individually coupled to said multiword bus and having a set of input address lines, said each memory unit including a plurality of rows of random access memory chips for providing storage of data words, one module unit including the even numbered rows containing storage locations having even addresses and the other module unit including the odd numbered rows containing storage locations having odd addresses, said random access memory chips including a number of addressable arrays of memory storage devices, said arrays being divided into a number of rows and columns;

an address register coupled to said bus for storing a number of the least significant address bits of each said memory request address;

row and column multibit tristate registers coupled to said bus for storing said row and column addresses respectively of each said memory request address and said row and column registers being connected to each of said sets of input address lines of said memory module units;

an adder circuit being coupled to said address register for receiving the least significant column address bits applied in parallel to said column tristate register, said adder circuit being operative to increment by one said column address bits in response to at least one of said least significant address bits during said transfer of said row address to said pair of memory units;

a selection circuit coupled to said address register for receiving said least significant row address bits applied in parallel to said row address register, to said adder circuit for receiving the result of incrementing said least significant column address bits and to the least significant address lines of said set of address lines of said memory module unit containing data words having said even addresses; and, timing means for generating the same predetermined sequence of bistate timing signals in response to each said memory request, said timing means being coupled to said row and column tristate address registers and to said selection circuit, said row tristate register and selection circuit being conditioned by the first state of one of said sequence of bistate timing signals to transfer said row address to said memory units during a row address interval defined by said first state of said one timing signal and said column tristate register and selection circuit being conditioned by another state of said one of said sequence of timing signals to transfer simultaneously said column address unincremented and incremented to said memory units during a column address interval defined by said another state of said one timing signal enabling simultaneous access to a pair of even and odd word locations within said number of said addressable arrays of said memory module units.

34. The subsystem of claim 33 wherein said subsyste. further includes:

row address selection means coupled to said bus for generating row address selection signals in response to a most significant bit portion of each address, said row selection means including a decoder circuit having a number of select input terminals connected to receive said most significant bit portion and a number of output terminals coupled to different ones of said memory module units, said decoder circuit being conditioned by said most significant bit portion to generate a decode output signal at one of said output terminals for enabling storage of said row address within a pair of said memory module units so as to provide said simultaneous access to said plurality of sequential storage locations.

35. The subsystem of claim 33 wherein said selection circuit includes a multiplexer circuit having a first set of input terminals coupled to said address register for receiving said least significant row address bits, a second set of input terminals connected to said adder circuit and a set of output terminals connected to said least significant address lines, said multiplexer circuit further including a control terminal connected to said timing means for receiving said one of said sequence of timing signals, said multiplexer circuit means being conditioned by changes in the state of said one of said sequence of timing signals to apply in succession said least significant row address bits and said least significant column address bits during row and column address intervals respectively to said least significant address lines of said module unit containing data words having said even addresses.

36. The subsystem of claim 35 wherein said adder circuit includes a carry input terminal coupled to said address register to receive said one least significant address bit, said adder circuit being operative in response to each predetermined state of said least significant address bit to increment by one said least significant column address bits applied to said selection circuit during said row address interval.

37. The subsystem of claim 35 wherein said predetermined state of said least significant address bit indicates a subboundary address condition occurring during the addressing of said sequential word storage locations along different columns of said memory module units and said adder circuit being operative in response to each said predetermined state to increment said least significant column address bits for enabling the addressing of a next sequential word location.

38. The subsystem of claim 37 wherein said predetermined state corresponds to a binary "1".

39. The subsystem of claim 38 wherein said row and column address registers, each include the same predetermined number of stages and wherein said adder circuit further includes n number of input terminals, coupled in parallel to said bus with n number of stages of said column register which store said least significant column address bits of said column address, said adder circuit being operative to increment by one said n number of least significant column address bits in response to said predetermined value of said least significant address bit indicating each occurrence of said subboundary address condition until said adder circuit generates an output address sum representative of an actual boundary address condition.

40. The subsystem of claim 39 wherein said actual boundary address condition is represented by a value which is $2^n$ times the frequence of occurrence of said subboundary address condition and wherein n is selected to have a value which extends said boundary address condition so as not to affect the performance of said memory subsystem.

41. The subsystem of claim 40 wherein said frequency of occurrence of said subboundary address condition is represented by the value 2 specified by a binary "1" state of said least significant address bit.

42. A memory subsystem for use in a system including a processing unit coupled to a multiword bus in common with said subsystem for transfer of data words therebetween during bus cycles of operation, said unit being operative to generate memory requests on said bus to said subsystem, each of said requests including a multibit address having row and column addresses coded to specify a storage location within said memory subsystem to be accessed, said subsystem comprising:

N number of independently addressable memory module units wherein N is any whole non-zero even integer, each memory unit being individually coupled to a different word section of said multiword bus and having a set of address input lines, said each memory unit including a plurality of rows of random access memory chips for providing storage of data words, N/2 module units including the even numbered rows containing storage locations having even addresses and N/2 module units including the odd addresses, said random access memory chips including a number of addressable arrays of memory storage devices, said arrays being divided into a number of rows and columns;

an address register coupled to said bus for storing a number of least significant address bits of each address memory request address;

first and second multibit tristate address registers each having a plurality of input terminals and a plurality of output terminals, a number of said input terminals of said first and second registers being coupled to said bus for receiving and storing said row and column addresses respectively and said number of corresponding ones of said output terminals of said first and second registers being connected in common with each of said sets of address lines;

M number of adder circuits wherein M is any whole non-zero integer, each being coupled to said address register for receiving the least significant column address bits applied in parallel to said second tristate address register, said adder circuit being operative to increment by one said least significant column address bits as a function of the coding of at least one of said least significant address bits during the transfer of said row address to said N number of memory module units; and, M number of selection circuits being coupled to said address register for receiving said least significant row address bits applied in parallel to said first register, to a corresponding one of said M adder circuits for receiving the result of incrementing said column address bits and to the least significant bit address lines of said address input lines of said N/2 memory module units containing data words having said even addresses, said M number of selection circuits being operative to apply said row and incremented least significant column address bits to said least significant address lines during successive time intervals enabling simultaneous access to a plurality of even and odd sequential word locations within said number of said addressable arrays of said memory module units.

* * * * *